United States Patent
Okamoto et al.

(10) Patent No.: US 10,867,577 B2
(45) Date of Patent: Dec. 15, 2020

(54) DISPLAY DEVICE INCLUDING DATA CONVERSION CIRCUIT

(71) Applicant: SEMICONDUCTOR ENERGY LABORATORY CO., LTD., Atsugi (JP)

(72) Inventors: Yuki Okamoto, Kanagawa (JP); Seiichi Yoneda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/469,260

(22) PCT Filed: Dec. 11, 2017

(86) PCT No.: PCT/IB2017/057769
§ 371 (c)(1),
(2) Date: Jun. 13, 2019

(87) PCT Pub. No.: WO2018/116049
PCT Pub. Date: Jun. 28, 2018

(65) Prior Publication Data
US 2020/0020298 A1 Jan. 16, 2020

(30) Foreign Application Priority Data
Dec. 23, 2016 (JP) .................................. 2016-250225

(51) Int. Cl.
*G09G 5/00* (2006.01)
*G09G 3/32* (2016.01)
(Continued)

(52) U.S. Cl.
CPC ........... *G09G 5/005* (2013.01); *G09G 3/3266* (2013.01); *G09G 3/3275* (2013.01); *G09G 3/32* (2013.01);
(Continued)

(58) Field of Classification Search
CPC ...... G09G 3/3266; G09G 3/3275; G09G 3/32; G09G 3/2096; G09G 3/3225; G09G 3/20;
(Continued)

(56) References Cited

U.S. PATENT DOCUMENTS

| 5,541,665 A * | 7/1996 | Urata | H04N 11/28 348/571 |
| 5,877,740 A | 3/1999 | Hirakata et al. | |

(Continued)

FOREIGN PATENT DOCUMENTS

| CN | 001165970 A | 11/1997 |
| DE | 0765078 | 10/1997 |

(Continued)

OTHER PUBLICATIONS

International Search Report (Application No. PCT/IB2017/057769) dated Feb. 20, 2018.

(Continued)

*Primary Examiner* — Ryan A Lubit
(74) *Attorney, Agent, or Firm* — Fish & Richardson P.C.

(57) ABSTRACT

Image processing in accordance with the shape of a display device is performed at high speed with low power consumption, without the use of a large frame memory or a high-throughput GPU. Used is a data conversion circuit including: a latch circuit that takes in data from input data in synchronization with a writing clock signal and stores the data as writing data; a memory circuit that stores the writing data and outputs the writing data to an external circuit as readout data in synchronization with a readout clock signal; and a clock selection control circuit. The writing clock signal is one of a plurality of clock signals with different frequencies and is output in accordance with control by the clock selection control circuit.

7 Claims, 25 Drawing Sheets

(51) Int. Cl.
*G09G 3/3275* (2016.01)
*G09G 3/3266* (2016.01)

(52) U.S. Cl.
CPC . *G09G 2310/08* (2013.01); *G09G 2320/0252* (2013.01); *G09G 2340/14* (2013.01); *G09G 2380/02* (2013.01); *G09G 2380/10* (2013.01)

(58) Field of Classification Search
CPC ....... G09G 2310/08; G09G 2310/0205; G09G 2310/0286; G09G 2320/0252; G09G 2320/0233; G09G 2340/14; G09G 2340/0414; G09G 2340/0421; G09G 2380/02; G09G 2380/10; G09G 5/005; H01L 27/1266; H01L 27/1225
See application file for complete search history.

(56) References Cited

U.S. PATENT DOCUMENTS

| | | | |
|---|---|---|---|
| 5,940,061 A * | 8/1999 | Sato | ................ G09G 5/005 345/99 |
| 6,876,339 B2 | 4/2005 | Hiroki | |
| 7,190,360 B1 | 3/2007 | Hiroki | |
| 7,639,058 B2 | 12/2009 | Kurokawa et al. | |
| 7,663,447 B2 | 2/2010 | Matsuzaki | |
| 7,782,315 B2 | 8/2010 | Hiroki | |
| 8,095,104 B2 | 1/2012 | Kawae et al. | |
| 8,103,897 B2 | 1/2012 | Endo et al. | |
| 8,510,588 B2 | 8/2013 | Endo et al. | |
| 9,479,145 B2 | 10/2016 | Okamoto et al. | |
| 9,569,713 B2 | 2/2017 | Yoneda et al. | |
| 2012/0081186 A1 | 4/2012 | Kawae et al. | |
| 2014/0340431 A1 | 11/2014 | Yamakawa | |
| 2014/0368479 A1 | 12/2014 | Bae et al. | |
| 2015/0172545 A1 | 6/2015 | Szabo et al. | |
| 2015/0185781 A1* | 7/2015 | Yu | ............ G06F 3/017 345/173 |
| 2015/0221065 A1* | 8/2015 | Kim | ............ G06F 1/1641 345/660 |
| 2016/0366360 A1 | 12/2016 | Okamoto et al. | |
| 2017/0047001 A1 | 2/2017 | Shin et al. | |
| 2017/0062309 A1* | 3/2017 | Ogras | ............ H05K 1/189 |
| 2017/0123505 A1 | 5/2017 | Markovic et al. | |
| 2017/0141776 A1 | 5/2017 | Kozuma | |
| 2017/0330531 A1 | 11/2017 | Yamazaki et al. | |
| 2017/0337867 A1 | 11/2017 | Yamazaki et al. | |
| 2017/0337871 A1 | 11/2017 | Kurokawa | |

FOREIGN PATENT DOCUMENTS

| | | |
|---|---|---|
| EP | 0765078 A | 3/1997 |
| JP | 07-184117 A | 7/1995 |
| JP | 08-221031 A | 8/1996 |
| JP | 09-093516 A | 4/1997 |
| JP | 09-093517 A | 4/1997 |
| JP | 2005-112251 A | 4/2005 |
| JP | 2007-049598 A | 2/2007 |
| JP | 2013-134295 A | 7/2013 |
| KR | 10-0223118 | 10/1999 |
| TW | 324790 | 1/1998 |

OTHER PUBLICATIONS

Written Opinion (Application No. PCT/IB2017/057769) dated Feb. 20, 2018.

* cited by examiner

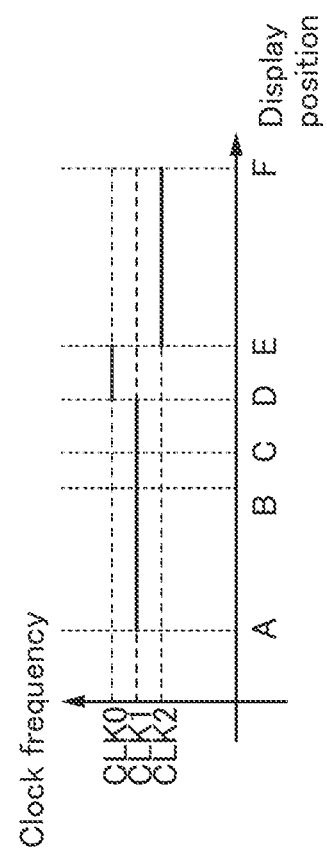
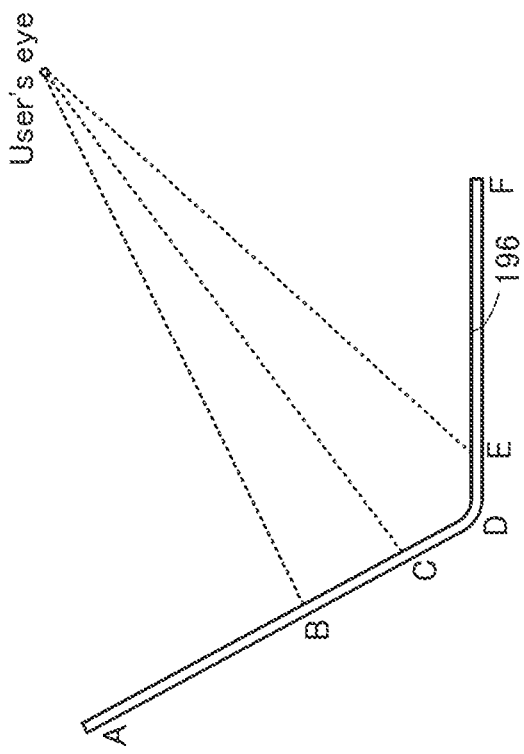

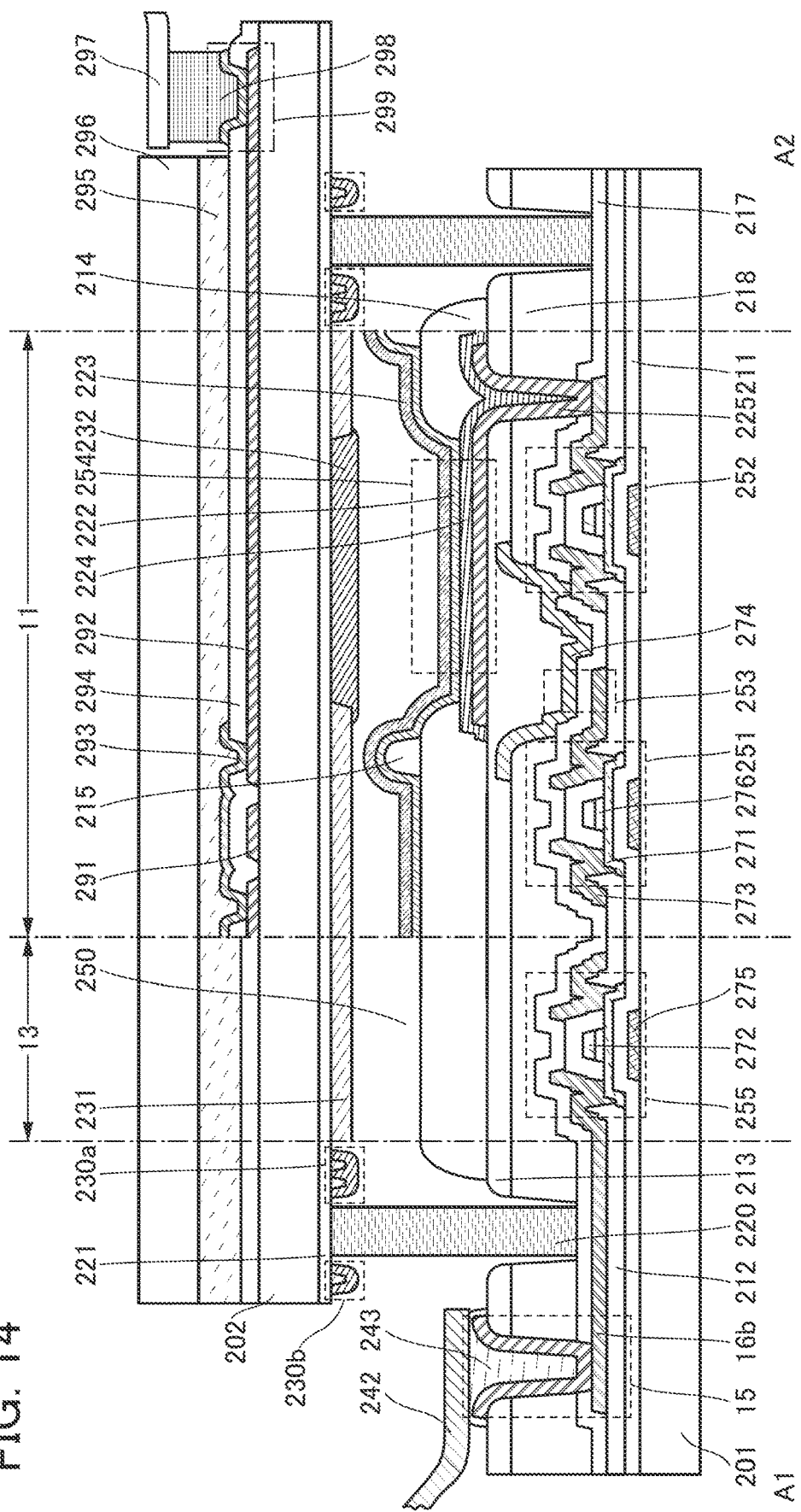

DISPLAY DEVICE INCLUDING DATA CONVERSION CIRCUIT

TECHNICAL FIELD

One embodiment of the present invention relates to a data conversion circuit and a display device.

BACKGROUND ART

A curved display including an organic electroluminescent (EL) element has been proposed (see Patent Document 1, for example). Note that the curved display means a display including a curved display surface.

It is expected that the use of the curved display for an instrument panel of a vehicle such as a car will lead to the design improvement (see Patent Document 2, for example).

REFERENCE

Patent Reference

[Patent Document 1] Japanese Published Patent Application No. 2013-134295
[Patent Document 2] Japanese Published Patent Application No. 2005-112251

DISCLOSURE OF INVENTION

An instrument panel of a car or the like has a complex (e.g., curved) shape in view of design. When a user sees information on the display device with such a shape, sight lines of the user and the display surface make inconstant angles. That is, the position of user's eyes relative to the display device with the curved surface decides a region easy to see and a region hard to see in the display device. Thus, image data for displaying an image on the display device should be processed in accordance with the shape of the display device.

Image processing in accordance with the shape of a display device is, for example, to copy data to be written in a pixel into an adjacent pixel (to blow up an image) or to decimate data. Image processing by software requires processing of the entire frame, and thus has difficulty in high-speed processing. The use of a large frame memory and high-throughput graphics processing unit (GPU) enables high-speed image processing; however, this increases power consumption.

An object of one embodiment of the present invention is to provide a data conversion circuit and a display device that are capable of high-speed image processing. Another object of one embodiment of the present invention is to provide a data conversion circuit and a display device that have low power consumption. Another object of one embodiment of the present invention is to provide a novel data conversion circuit and a novel display device.

One embodiment of the present invention is a data conversion circuit including: a latch circuit that takes in data from input data in synchronization with a writing clock signal and stores the data as writing data; a memory circuit that stores the writing data and outputs the writing data to an external circuit as readout data in synchronization with a readout clock signal; and a clock selection control circuit. The writing clock signal is one of a plurality of clock signals with different frequencies and is output in accordance with control by the clock selection control circuit.

In the data conversion circuit of one embodiment of the present invention, the memory circuit is preferably a line memory.

In the data conversion circuit of one embodiment of the present invention, the external circuit is preferably a source driver.

In the data conversion circuit of one embodiment of the present invention, the writing clock signal is preferably supplied to a writing address generation circuit that generates writing address data for writing the writing data to the memory circuit, and the readout clock signal is preferably supplied to a readout address generation circuit that generates readout address data for reading out the readout data from the memory circuit.

One embodiment of the present invention is a display device including: a latch circuit that takes in data from input data in synchronization with a writing clock signal and stores the data as writing data; a memory circuit that stores the writing data and outputs the writing data to a source driver as readout data in synchronization with a readout clock signal; a first clock selection control circuit; a second clock selection control circuit; and a gate driver control circuit that outputs a gate driver control signal for driving a gate driver in synchronization with a gate line clock signal. The writing clock signal is one of a plurality of clock signals with different frequencies and is output in accordance with control by the first clock selection control circuit. The gate line clock signal is one of a plurality of clock signals with different frequencies and is output in accordance with control by the second clock selection control circuit.

In the display device of one embodiment of the present invention, the memory circuit is preferably a line memory.

In the display device of one embodiment of the present invention, the writing clock signal is preferably supplied to a writing address generation circuit that generates writing address data for writing the writing data to the memory circuit, and the readout clock signal is preferably supplied to a readout address generation circuit that generates readout address data for reading out the readout data from the memory circuit.

According to one embodiment of the present invention, a data conversion circuit and a display device that are capable of high-speed image processing can be provided. According to one embodiment of the present invention, a data conversion circuit and a display device that have low power consumption can be provided. According to one embodiment of the present invention, a novel data conversion circuit and a novel display device can be provided.

BRIEF DESCRIPTION OF DRAWINGS

FIGS. 9A and 9B show a structure example of a display device according to an embodiment.

FIG. 14 shows a structure example of a touch panel according to an embodiment.

BEST MODE FOR CARRYING OUT THE INVENTION

Figure 1:
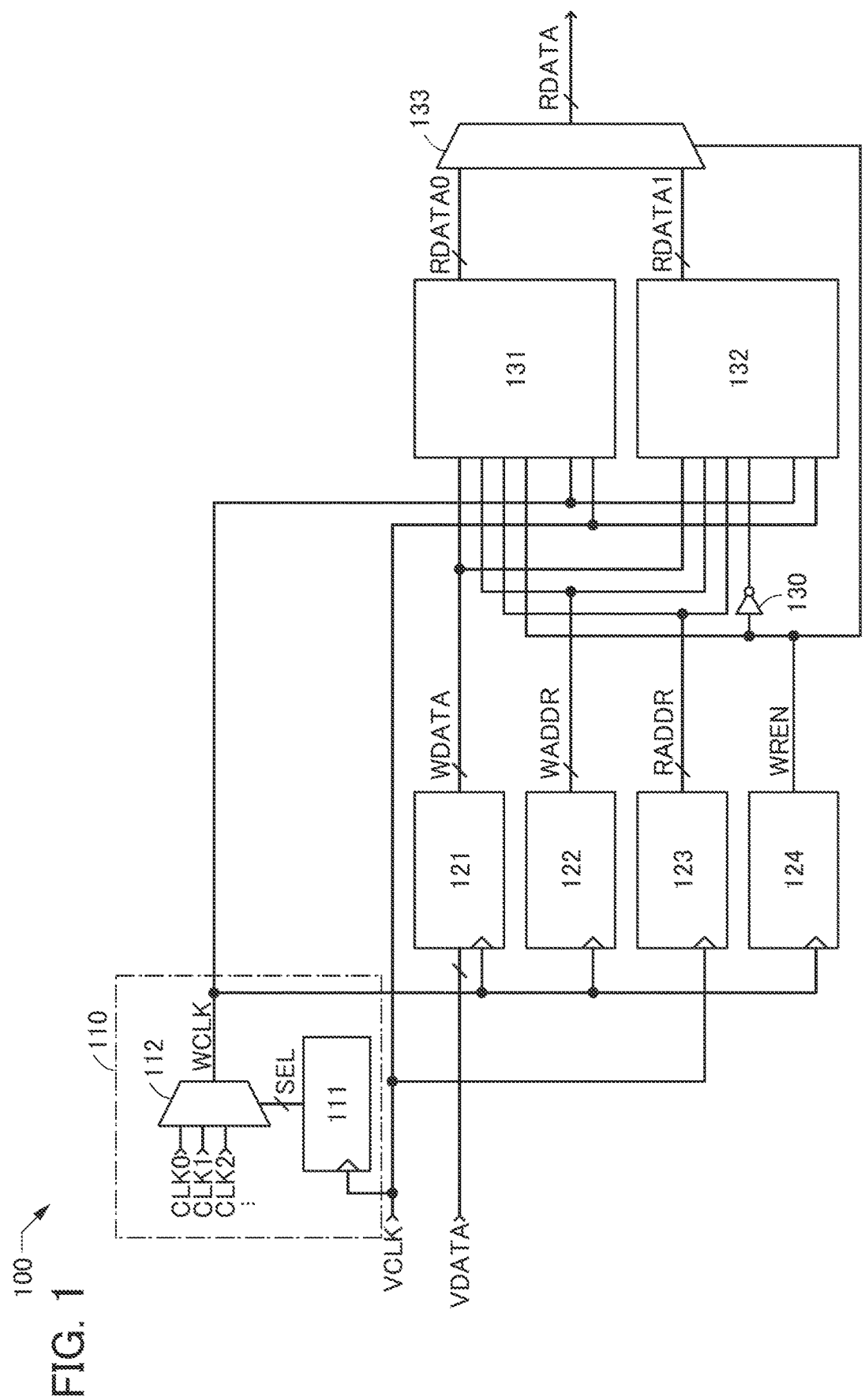
FIG. 1 shows a structure example of a data conversion circuit according to an embodiment.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Any of the embodiments below can be combined as appropriate. In addition, in the case where a plurality of structure examples are described in one embodiment, some of the structure examples can be combined as appropriate.

Embodiment 1

This embodiment will describe structure examples of a data conversion circuit of one embodiment of the present invention and a display device including the data conversion circuit with reference to FIG. 1 to FIG. 5.

FIG. 1 is a block diagram of a data conversion circuit 100 of one embodiment of the present invention. The data conversion circuit 100 generates converted data for correcting image distortion due to a shape folded in the long axis direction of a source driver of a display device.

The data conversion circuit 100 includes a clock generation circuit 110, a data latch circuit 121, a writing address generation circuit 122, a readout address generation circuit 123, an enable generation circuit 124, a memory circuit 131, a memory circuit 132, and a data selection circuit 133.

The clock generation circuit 110 includes a clock selection control circuit 111 and a switching circuit 112. The clock selection control circuit 111 outputs a selection signal SEL with which the switching circuit 112 selects one of a plurality of clock signals (e.g., CLK0, CLK1, and CLK2) with different frequencies. The selection signal SEL has a function of switching a clock signal WCLK to a clock signal selected by the switching circuit 112. The clock signal WCLK is also referred to as a writing clock signal.

The clock generation circuit 110 sends the clock signal WCLK selected by the switching circuit 112 to the memory circuit 131, the memory circuit 132, and other circuits. The clock selection control circuit 111 includes data on a frequency and switching timing thereof that are suitable for correcting distortion due to a shape folded in the long axis direction of the source driver of the display device. The clock selection control circuit 111 outputs the selection signal SEL in accordance with the data. The data may be set by a user in accordance with a shape folded in the long axis direction of the source driver of the display device. The data may be automatically set on the basis of a distortion signal from a distortion sensor attached to the display device. The data may be unchangeable, fixed data.

When image data to be supplied to a certain pixel is to be copied (extended) to a pixel adjacent in the long axis direction of the source driver, the clock generation circuit 110 sets a clock signal with a frequency higher than a reference frequency as the clock signal WCLK. This enables loading of the data by the memory circuits 131 and 132 without image processing. When image data to be supplied to certain pixels is to be decimated in the long axis direction of the source driver, a clock signal with a frequency lower than a reference frequency is set as the clock signal WCLK. This enables loading of the data by the memory circuits 131 and 132 without image processing.

The data latch circuit 121 loads input image data VDATA synchronized with a clock signal VCLK in synchronization with the clock signal WCLK, and outputs the loaded data as writing data WDATA. The writing data WDATA is used as writing data for the memory circuits 131 and 132.

The writing address generation circuit 122 has a function of generating writing address data WADDR for the memory circuits 131 and 132 in synchronization with the clock signal WCLK.

The readout address generation circuit 123 has a function of generating readout address data RADDR for the memory circuits 131 and 132 in synchronization with the clock signal VCLK.

The enable generation circuit 124 has a function of generating a writing-reading enable signal WREN for the memory circuits 131 and 132 in synchronization with the clock signal WCLK.

The memory circuits 131 and 132 each have a function as a line memory for storing image data for one line. The memory circuit 131 receiving the high-level writing-reading enable signal WREN (the memory circuit 132 receiving a signal that is obtained by inverting the low-level writing-reading enable signal WREN with an inverter circuit) writes the writing data WDATA in an address assigned by the writing address data WADDR, in synchronization with the clock signal WCLK. The memory circuit 131 receiving the low-level writing-reading enable signal WREN (the memory circuit 132 receiving a signal that is obtained by inverting the high-level writing-reading enable signal WREN with the inverter circuit) outputs data stored in an address assigned by the readout address data RADDR as readout data RDATA0 (RDATA1) in synchronization with the clock signal VCLK. The memory circuit 131 is supplied with the writing-reading enable signal WREN, and the memory circuit 132 is supplied with a signal obtained by inverting the writing-reading enable signal WREN with the inverter circuit 130. Thus, data writing is performed in one of the memory circuits 131 and 132 while data readout from the other is performed.

In accordance with the writing-reading enable signal WREN, the data selection circuit 133 outputs the data (the readout data RDATA0 or the readout data RDATA1) that has been stored in the memory circuit 131 or the memory circuit 132, whichever is in a readout state, to an external circuit as readout data RDATA. The external circuit is a source driver of the display device. The data selection circuit 133 uses the writing-reading enable signal WREN to control data readout from the memory circuit 131 or 132 so that the readout data, corrected data, can maintain its real-time property.

The structure of the data conversion circuit 100 of one embodiment of the present invention shown in FIG. 1 enables output of image data that matches with the shape of the display device without special image processing by software. That is, low-power, high-speed image processing can be performed. According to one embodiment of the present invention, image data can be processed in accordance with the shape of the display device without the use of a large-capacity memory circuit such as a frame memory. According to one embodiment of the present invention, a bendable display device can display an image from which a user feels no distortion as a whole.

Figure 2:
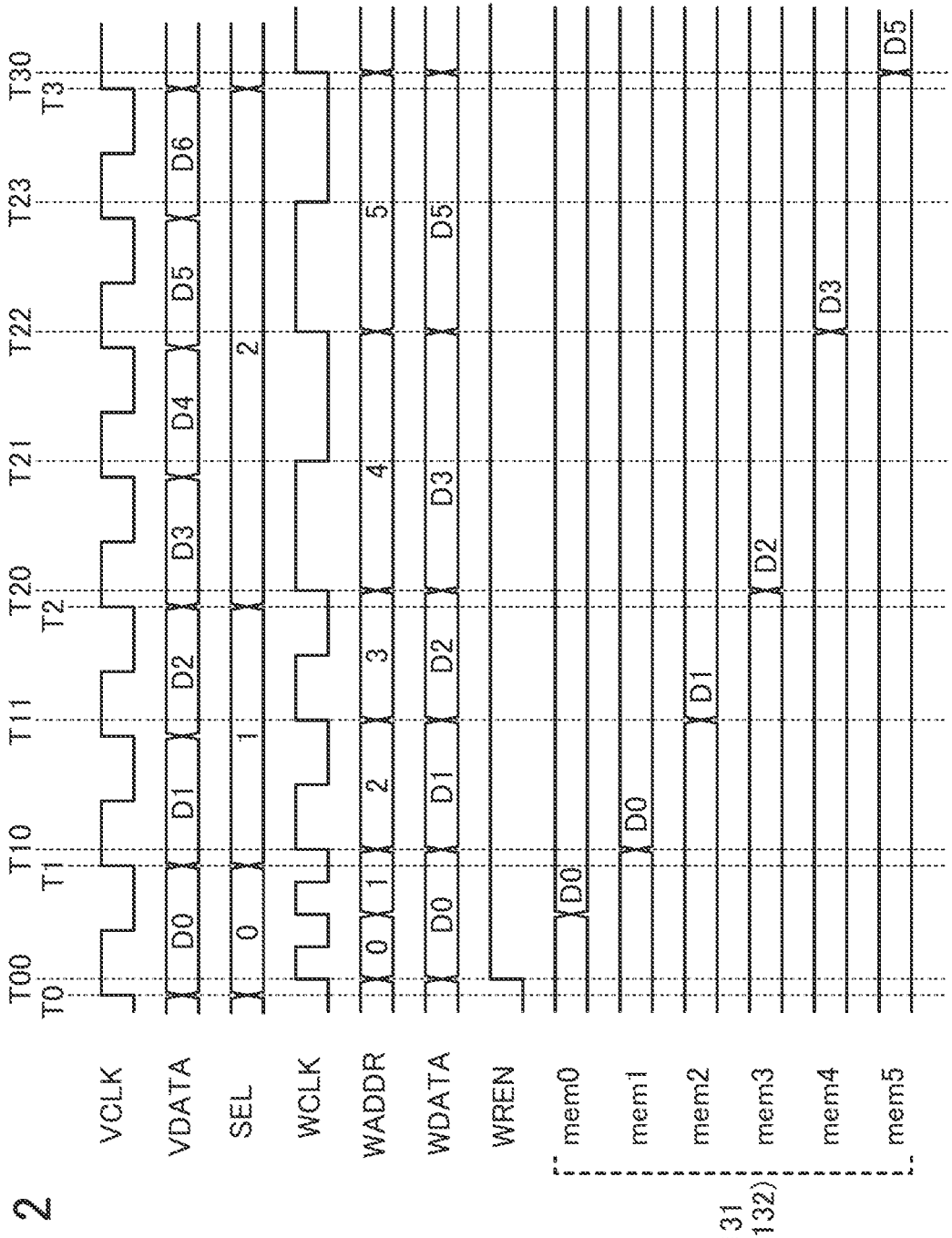
FIG. 2 shows a structure example of a data conversion circuit according to an embodiment.
Figure 3:
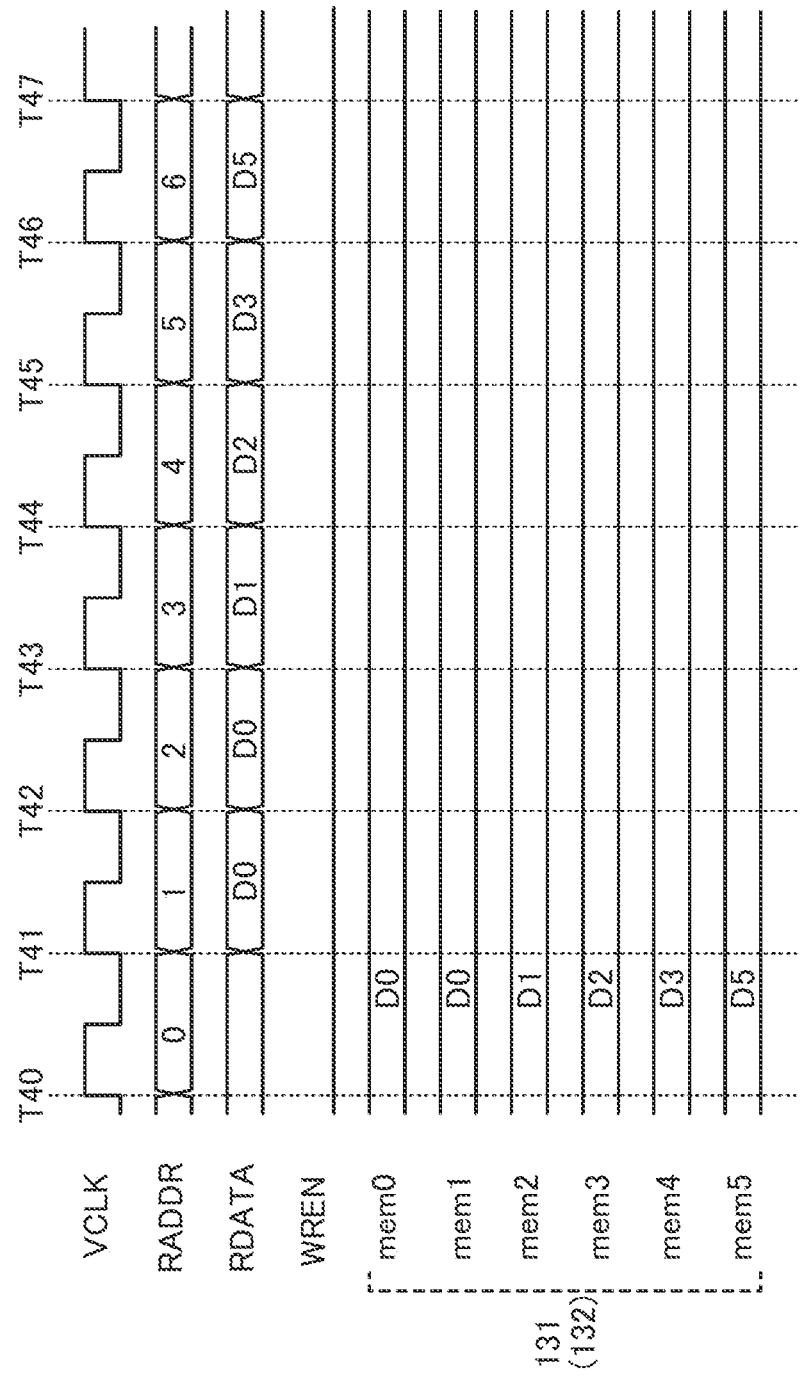
FIG. 3 shows a structure example of a data conversion circuit according to an embodiment.

FIG. 2 and FIG. 3 are timing charts illustrating the operation of the data conversion circuit 100 of FIG. 1.

FIG. 2 illustrates image data writing to the memory circuits 131 and 132 for correction, and FIG. 3 illustrates image data readout from the memory circuits 131 and 132 after the writing in FIG. 2. FIG. 2 and FIG. 3 illustrate the operation of the memory circuit 131; the timing charts with an interchange of a high level and a low level of the writing-reading enable signal WREN can explain the operation of the memory circuit 132.

FIG. 2 is described here. The selection signal SEL makes the switching circuit 112 select the clock signal WCLK to be output by the clock generation circuit 110. The switching circuit 112 outputs CLK0 when the selection signal SEL is "0", outputs CLK1 when the selection signal SEL is "1", and outputs CLK2 when the selection signal SEL is "2". The number of clock signals is not limited to the above, and other clock signals such as CLK3 or CLK4 may be selected. FIG. 2 shows the clock signals CLK0, CLK1, and CLK2 as an example. The clock signal CLK0 has twice as high a frequency as the clock signal VCLK. The clock signal CLK1 has as high a frequency as the clock signal VCLK. The clock signal CLK2 has half as high a frequency as the clock signal VCLK. The clock signal VCLK is also referred to as a reference clock signal.

At time T0, the clock selection control circuit 111 outputs a signal of "0" as the selection signal SEL (the signal is hereinafter expressed as SEL=0 in short), whereby CLK0 is selected as the clock signal WCLK.

From time T00 to time T10, the enable generation circuit 124 outputs a signal of "1" as the writing-reading enable signal WREN (the signal is hereinafter expressed as WREN=1 in short) to make the memory circuit 131 writable. The data latch circuit 121 obtains data D0 of the input image data VDATA (the data is hereinafter expressed as VDATA=D0 in short) in synchronization with the clock signal VCLK, and outputs the data D0 of the writing data WDATA (the data is hereinafter expressed as WDATA=D0 in short) in synchronization with the clock signal WCLK. The writing address generation circuit 122 outputs a signal of "0" as the writing address data WADDR (the signal is hereinafter expressed as WADDR=0 in short) and subsequently outputs WADDR=1. As a result, the data D0 is written in mem0 (an address 0 of the memory circuit 131) and mem1 (an address 1 of the memory circuit 131). That is, the same image data is written in the two continuous addresses, and thus data for a certain pixel will be copied in an adjacent pixel. Consequently, a blown-up image can be displayed. Such operation is possible because the clock signal WCLK has twice as high a frequency as the clock signal VCLK, the reference clock signal.

At time T1, the clock selection control circuit 111 outputs SEL=1, so that CLK1 is selected as the clock signal WCLK.

From time T10 to time T20, the data latch circuit 121 obtains VDATA=D1 in synchronization with the clock signal VCLK, outputs WDATA=D1 in synchronization with the clock signal WCLK, subsequently obtains VDATA=D2 in synchronization with the clock signal VCLK, and outputs WDATA=D2 in synchronization with the clock signal WCLK. The writing address generation circuit 122 outputs WADDR=2 and subsequently outputs WADDR=3. As a result, data D1 is written in mem2 (an address 2 of the memory circuit 131) and then the data D2 is written in mem3 (an address 3 of the memory circuit 131). This operation corresponds to normal driving; that is, image data are individually stored in the corresponding addresses. Thus, an image is uncorrected in this period and output without any change. This is because the clock signal WCLK has the same frequency as the clock signal VCLK. Note that certain processing before or after this period might shift the writing address data WADDR and thus displace the writing data from those in the case of performing no correction. In that case, the data is displayed in a pixel different from the pixel that should display the image in the case of performing no correction.

At time T2, the clock selection control circuit 111 outputs SEL=2, so that CLK2 is selected as the clock signal WCLK.

From time T20 to time T30, the data latch circuit 121 obtains VDATA=D3 in synchronization with the clock signal VCLK, outputs WDATA=D3 in synchronization with the clock signal WCLK, subsequently obtains VDATA=D5 in synchronization with the clock signal VCLK, and outputs WDATA=D5 in synchronization with the clock signal WCLK. The writing address generation circuit 122 outputs WADDR=4 at time T20 and subsequently outputs WADDR=5 at time T22. As a result, data D3 is written in mem4 (an address 4 of the memory circuit 131) and then the data D5 is written in mem5 (an address 5 of the memory circuit 131). Accordingly, data D4 is skipped and written in no address. That is, image data excluding data for one pixel in the original image is stored in two continuous addresses; thus, the data D4 is displayed by no pixel and the image data can be decimated in the extending direction of a wiring (a source line). As a result, a shrunk image can be displayed. Such operation is possible because the clock signal WCLK has half as high a frequency as the clock signal VCLK.

Although not illustrated, the enable generation circuit 124 outputs WREN=0 after completion of all the data processing for one line, enabling readout from the memory circuit 131.

Next, FIG. 3 is described. FIG. 3 shows a state after the data writing to each address in FIG. 2. Thus, at time T40, the memory circuit 131 stores mem0=D0, mem1=D0, mem2=D1, mem3=D2, mem4=D3, and mem5=D5. At time T40, the readout address generation circuit 123 outputs a signal of "0" as the readout address data RADDR (the signal is hereinafter expressed as RADDR=0 in short). At time T41, RDATA=D0 as the data of mem0 is read out from the memory circuit 131. In addition, the readout address generation circuit 123 outputs RADDR=1. At time T42, RDATA=D0 as the data of mem1 is read out from the memory circuit 131. In addition, the readout address generation circuit 123 outputs RADDR=2. At time T43, T44, T45, T46, T47, and thereafter, data are similarly read out; accordingly, the image data for one line is read out from the memory circuit 131.

When the data read out in such a way is displayed on the display device, the data D0 is displayed by two continuous pixels, so that the image in that portion is apparently blown up. The data D1 and the data D2 are displayed by the corresponding pixels without any deletion or addition, so that the image in that portion seems normal. A pixel displaying the data D3 is adjacent to a pixel displaying the data D5 and no pixel displays the data D4, so that the image in that portion is apparently shrunk.

The frequency of the clock signal VCLK used for data readout from the memory circuit 131 is constant. Thus, the data written in the predetermined addresses such as mem0 and mem1 of the memory circuit 131 are sequentially read out without any special processing, whereby data that is desirably corrected can be output.

The above-described switching of the frequencies of the clock signal for writing to the memory circuit 131 enables image blow-up or image shrinkage by decimation. Therefore, image distortion due to the shape of the display device folded in the long axis direction of the source driver can be corrected without any special image processing by software.

Figure 4:
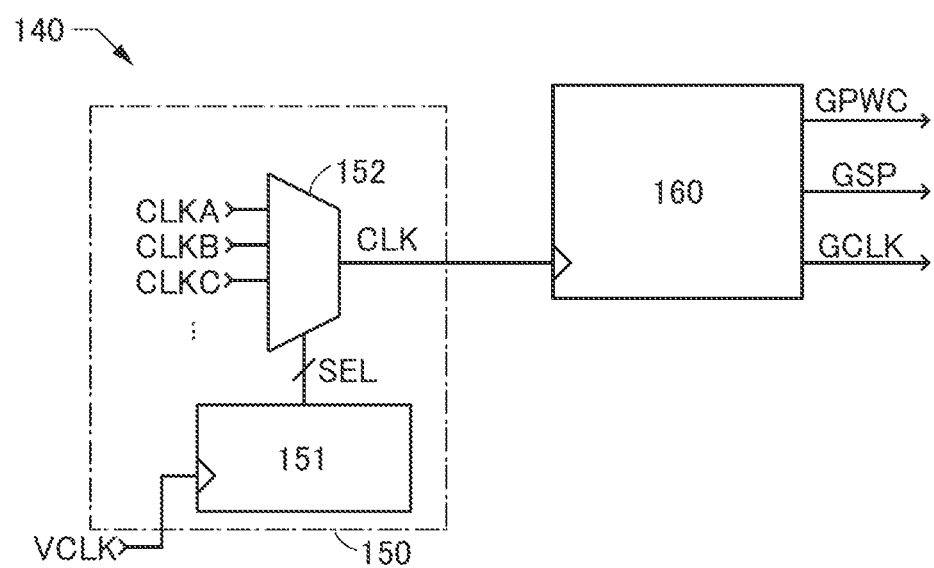
FIG. 4 shows a structure example of a data conversion circuit according to an embodiment.

FIG. 4 is a block diagram of a data conversion circuit 140 of one embodiment of the present invention. The data conversion circuit 140 generates converted data for correcting image distortion due to a folded shape in the long axis direction of a gate driver of a display device.

The data conversion circuit 140 includes a clock generation circuit 150 and a gate driver control circuit 160.

The clock generation circuit 150 includes a clock selection control circuit 151 and a switching circuit 152. The switching circuit 152 selects and outputs one of a plurality of clock signals (e.g., CLKA, CLKB, and CLKC) with different frequencies on the basis of the selection signal SEL of the clock selection control circuit 151. The selection signal SEL has a function of switching the clock signal CLK to a clock signal selected by the switching circuit 152.

The clock generation circuit 150 sends the clock signal CLK selected in the switching circuit 152 to the gate driver control circuit 160. The clock selection control circuit 151 includes data relating to a suitable frequency and switching timing thereof for correcting distortion due to a shape folded in the long axis direction of the gate driver of the display device. The clock selection control circuit 151 outputs the selection signal SEL for controlling a clock signal output in accordance with the data. The data may be set by a user in accordance with a shape folded in the long axis direction of the gate driver of the display device. The data may be automatically set on the basis of a distortion signal from a distortion sensor attached to the display device. The data may be fixed data unable to be changed.

The gate driver control circuit 160 has a function of outputting a gate line pulse width control signal GPWC (also referred to as a signal GPWC), a gate line start pulse signal GSP (also referred to as a signal GSP), and a gate line clock signal GCLK (also referred to as a signal GCLK) in synchronization with the clock signal CLK output from the clock generation circuit 150. Thus, the speeds of the signals GPWC, GSP, and GCLK are proportional to the frequency of the clock signal CLK.

Figure 5:
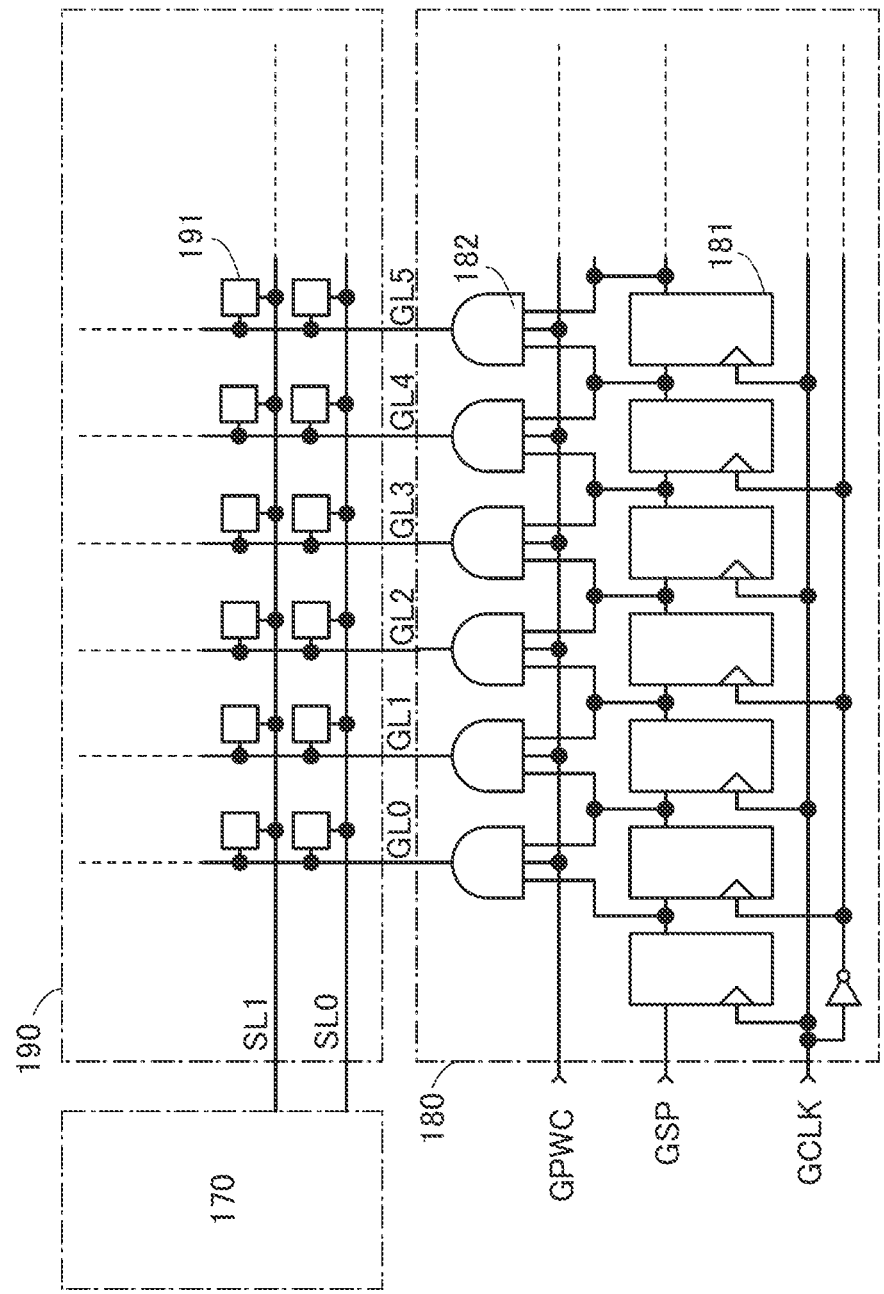
FIG. 5 shows a structure example of a data conversion circuit according to an embodiment.

FIG. 5 is a block diagram illustrating a structure of a display device. FIG. 5 illustrates a pixel array 190, a source driver 170, and a gate driver 180. A gate driver that is suitably controlled by the data conversion circuit 140 of FIG. 4 can have a circuit structure shown in FIG. 5, for example.

In FIG. 5, the operation of the gate driver 180 is controlled by the signals GPWC, GSP, and GCLK. Specifically, the signal GSP is transmitted through a shift register 181 to a circuit of the next stage in synchronization with the signal GCLK. An AND circuit 182 outputs the logical AND of an output signal from the shift register 181 and the signal GPWC; the logical AND is a signal output from the gate driver 180 to a gate line such as GL0, GL1, or GL2.

Thus, when all the signals GPWC, GSP, and GCLK operate in the halved period, a selection period of gate lines halves. Therefore, the same data can be written to two gate lines, so that the data can be copied (extended) in the long axis direction of the gate driver. On the other hand, when all the signals GPWC, GSP, and GCLK operate in the doubled period, the selection period of gate lines doubles. Thus, certain data sent from the source driver is stored in no pixel, so that the data can be decimated in the long axis direction of the gate driver.

Figure 6:
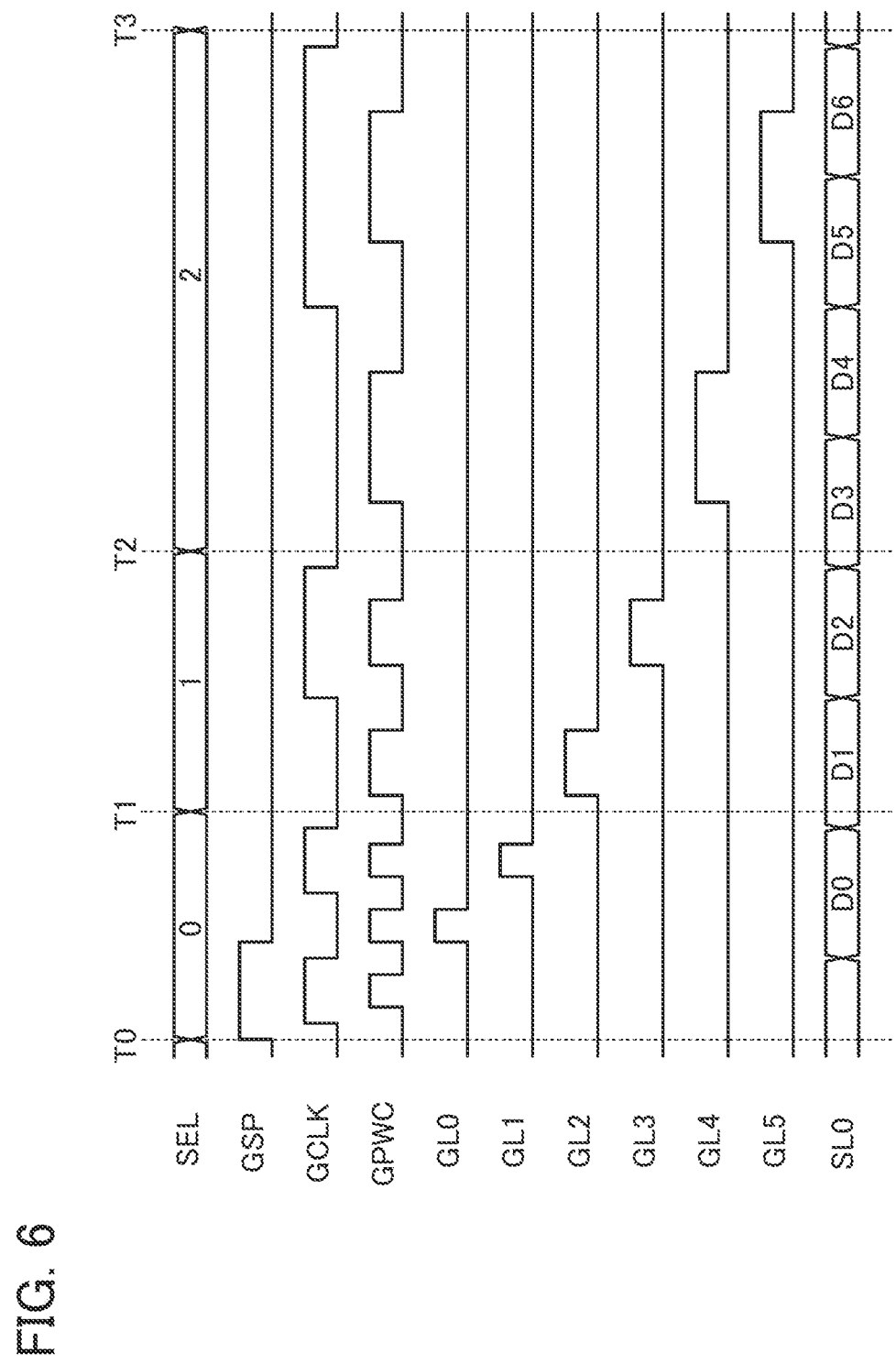
FIG. 6 shows a structure example of a data conversion circuit according to an embodiment.

FIG. 6 is a timing chart for explaining the operation of the data conversion circuit 140 of FIG. 4 that controls the gate driver 180 of FIG. 5. Explanation of FIG. 6 focuses on a source line SL0 extending from the source driver 170 and a pixel 191 connected to the source line SL0 of FIG. 5.

FIG. 6 is described here. The selection signal SEL is a signal for selecting the clock signal CLK output by the clock generation circuit 150. The switching circuit 152 outputs the clock signal CLKA when the selection signal SEL is "0", outputs the clock signal CLKB when the selection signal SEL is "1", and outputs the clock signal CLKC when the selection signal SEL is "2". The number of clock signals is not limited to the above, and other clock signals such as CLKD or CLKE may be selected. FIG. 6 shows the clock signals CLKA, CLKB, and CLKC as an example. The clock signal CLKA has twice as high a frequency as a clock signal used for normal driving. The clock signal CLKB has as high a frequency as the clock signal used for normal driving. The clock signal CLKC has half as high a frequency as the clock signal used for normal driving.

At time T0, the clock selection control circuit 151 outputs the signal of SEL=0, so that the clock signal CLKA is selected as the clock signal CLK.

From time T0 to time T1, the signals GPWC, GSP, and GCLK output from the gate driver control circuit 160 have the frequencies twice as high as those in normal display without correction. Thus, the gate lines GL become active, i.e., at a high level, in half the period. On the other hand, when no clock signal is controlled for the source driver 170, the source driver 170 operates with the same periodicity as that in the normal display. Thus, two gate lines become active while the source driver 170 outputs one image data.

As a result, the same data D0 is written to a pixel connected to the gate line GL0 and a pixel connected to the gate line GL1, whereby a blown-up image can be displayed.

At time T1, the clock selection control circuit 151 outputs the signal of SEL=1, so that the clock signal CLKB is selected as the clock signal CLK.

From time T1 to time T2, the signals GPWC, GSP, and GCLK output from the gate driver control circuit 160 have the same frequencies as those in normal display without correction. Thus, the gate lines GL become active with the same periodicity as those in normal display without correction. When no clock signal is controlled for the source driver 170, the source driver 170 operates with the same periodicity as that in the normal display. Thus, one gate line becomes active while the source driver 170 outputs one image data. As a result, the data D1 is written to a pixel connected to the gate line GL2 and the data D2 is written to a pixel connected to the gate line GL3, whereby the operation corresponding to the normal display can be performed.

At time T2, the clock selection control circuit 151 outputs the signal of SEL=2, so that the clock signal CLKC is selected as the clock signal CLK.

From time T2 to time T3, the signals GPWC, GSP, and GCLK output from the gate driver control circuit 160 have the frequencies half as high as those in normal display without correction. Thus, the gate lines GL become active in twice the period. On the other hand, when no clock signal is controlled for the source driver, the source driver operates with the same periodicity as that in the normal display. Thus, one gate line becomes active while the source driver 170 outputs two image data. As a result, the data D4 is written to a pixel connected to the gate line GL4 and the data D6 is written to a pixel connected to the gate line GL5 while none of the data D3 and D5 are written, whereby a shrunk image can be displayed.

Since the data D0 is displayed by two continuous pixels, the image in that portion is apparently blown up in the long axis direction of the gate driver. The data D1 and the data D2 are displayed by the corresponding pixels without any deletion or addition, so that the image in that portion seems normal. The data D4 is displayed in a pixel adjacent to the pixel displaying the data D2 and the data D6 is displayed in a pixel adjacent to the pixel displaying the data D4, while the data D3 and D5 are not displayed. Thus, the image in these pixels is apparently shrunk in the long axis direction of the gate driver.

As described above, an image can be blown up or shrunk in accordance with the frequency of the clock signal of the gate driver control circuit 160. This enables the correction corresponding to the folded shape in the long axis direction of the gate driver.

Embodiment 2

The combination use of the data conversion circuit 100 of FIG. 1 and the data conversion circuit 140 of FIG. 4 that are described in the above embodiment enables correction of image distortion in both the long axis direction of the source driver and the long axis direction of the gate driver. Such combination allows image correction due to any shape distortion in the display device.

Figure 7:
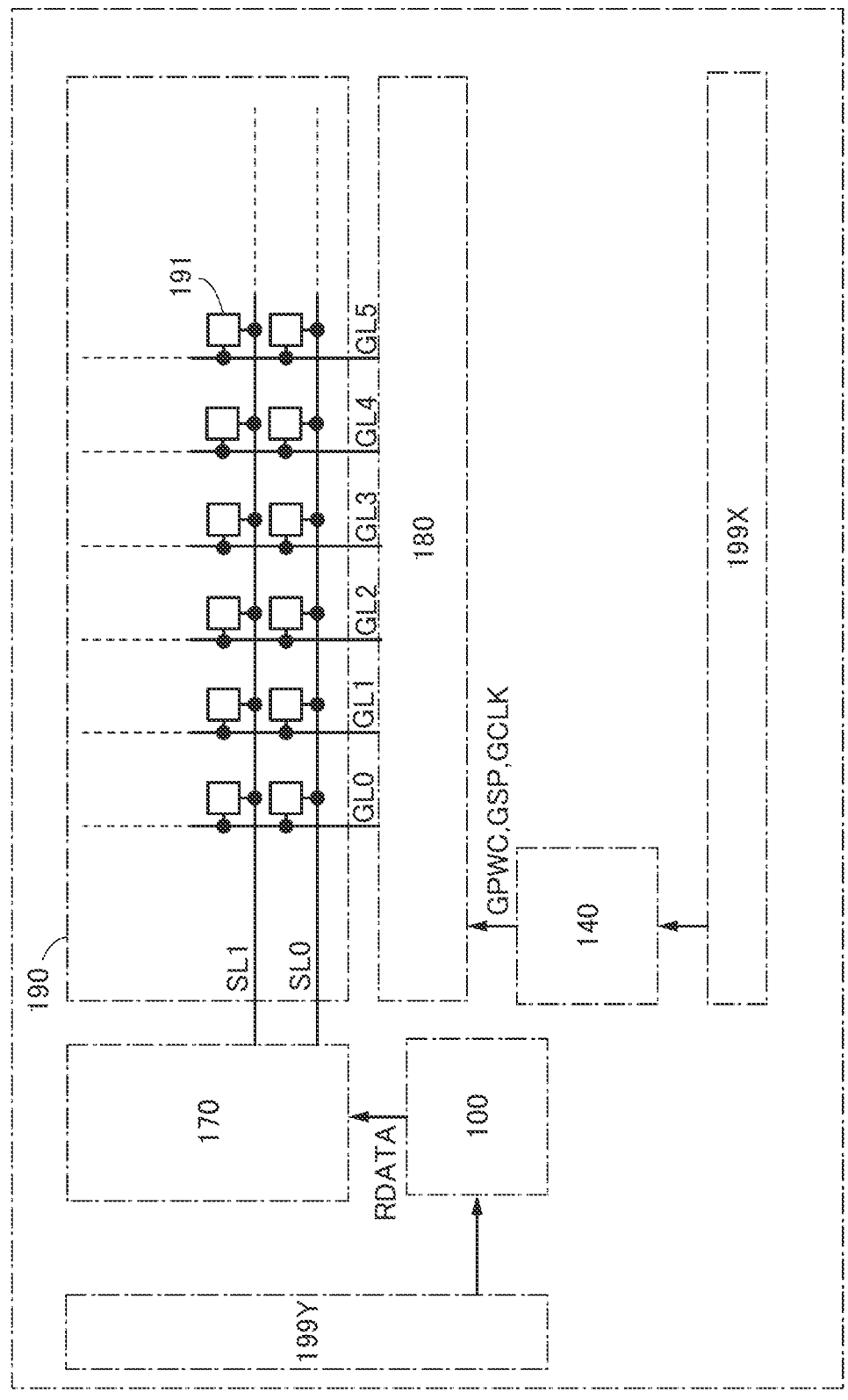
FIG. 7 shows a structure example of a display device according to an embodiment.

For example, such correction can be performed by supplying the data RDATA to the source driver 170 through the data conversion circuit 100 of FIG. 1, as shown in a display device 195 of FIG. 7. In addition, such correction can be performed by supplying the signals GPWC, GSP, and GCLK to the gate driver 180 through the data conversion circuit 140 of FIG. 4.

The above structure enables correction corresponding to a folded shape of the display device. This correction may be set by a user in advance. This correction may be performed on a real-time basis with real-time data of a folded shape obtained by distortion sensors 199X and 199Y that are provided as shown in FIG. 7.

Figure 8A:
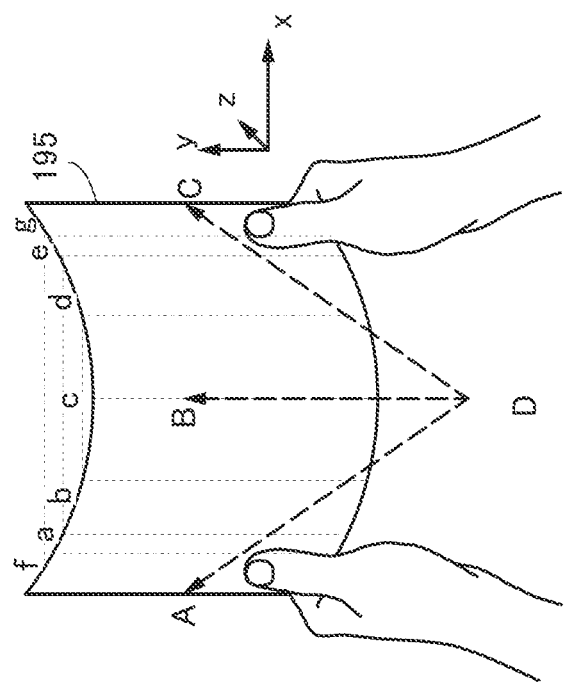
FIGS. 8A and 8B show a structure example of a display device according to an embodiment.

An example of a specific operation is explained with reference to FIGS. 8A and 8B. In the example of FIG. 8A, a user sees the foldable display device 195 from a point D. Here, the foldable display device 195 is used with a display portion that includes a pixel array bent. In the foldable display device 195 given as an example here, the x direction is the long axis direction of the source driver and they direction is the long axis direction of the gate driver.

Seeing the foldable display device 195 from the point D, the user can squarely look at a point B on the display device 195. On the other hand, the user cannot see a point A and a point C squarely from the point D. Images at the point A and those at the point C are apparently closed up because of distortion of the foldable display device 195. Thus, when the foldable display device 195 is used in a state of being bent, the image data is preferably blown up in the horizontal direction.

Figure 8B:
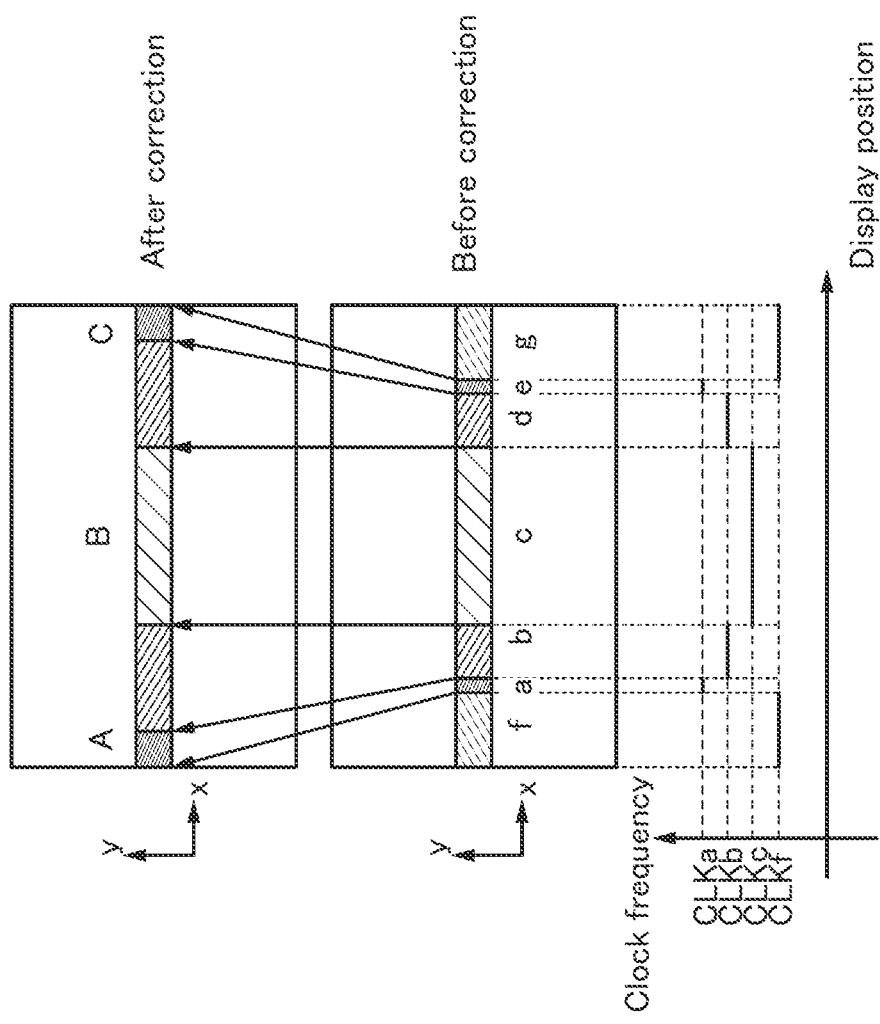

FIG. 8B schematically illustrates how an image to be displayed on the display portion of the display device 195 is corrected. Image data before correction is blown up in the horizontal direction in accordance with the bent shape; the obtained data is corrected data. Here, a clock signal CLKc is a reference clock signal. A clock signal CLKb has twice as high a frequency as the clock signal CLKc. A clock signal CLKa has four times as high a frequency as the clock signal CLKc. A clock signal CLKf does not oscillate.

Image data for a region c is displayed as it is. In that case, the data conversion circuit 100 uses the clock signal CLKc as the clock signal WCLK in the timing of sending the image data for the region c. Image data for a region b and a region d are blown up twice and displayed. In that case, the data conversion circuit 100 uses the clock signal CLKb as the clock signal WCLK in the timing of sending the image data for the region b and the region d. Image data for a region a and a region e are blown up four times and displayed. In that case, the data conversion circuit 100 uses the clock signal CLKa as the clock signal WCLK in the timing of sending the image data for the region a and the region e.

The clock signals CLKa and CLKb have higher frequencies than the reference clock signal CLKc; thus, the image data for the regions a and b are copied as image data to be supplied to adjacent pixels. Thus, the clock signal CLKf is used for a region f and a region g to stop clock oscillation so as to adjust the amount of data written in one line. The sizes of the regions f and g depend on the sizes of the regions a, b, d, and e, and image data for one line crossing all the regions can be stored in a line memory.

Another operation example is described with reference to FIGS. 9A and 9B. FIGS. 9A and 9B schematically illustrate a display device 196 that senses a user's sight line and corrects an image to be displayed on the display portion.

The sight line may be sensed by eye tracking. One of the eye tracking methods is a contactless method in which a user's eye is irradiated with weak infrared light and an image of the eye is taken with a camera. Although not illustrated in FIG. 9A, a camera is preferably included in the display device 196.

In the example of FIG. 9A, a user sees a point C. In that case, correction is preferably performed such that the user can clearly see a region between a point B and a point E. Note that the points B and E are not limited to the positions in the drawing, and may be changed depending on users. A clock signal CLK1 is a reference clock, and a clock signal CLK0 has twice as high a frequency as the clock signal CLK1. A clock signal CLK2 has half as high a frequency as the clock signal CLK1.

An example of correction of an image to be displayed on the display portion of the display device 196 of FIG. 9A is explained. First, in a region between a point A and a point D, an angle between a user's sight line and the display portion of the display device 196 varies little. Thus, data is converted with the clock signal CLK1. The foldable display device 196 is bent at the point D, and the user cannot see a region between the point D and the point E squarely. Thus, it is effective to blow up image data for the region between the points D and E in accordance with distortion of the foldable display device 196. Therefore, the clock signal CLK0 is used for image processing.

A display portion in a region from the point E to a point F of the display device 196 is outside the user's sight line. An image is not necessarily clear in this display portion and image data can be decimated. Thus, the clock signal CLK2 is used.

Change in clock signal frequencies in the above manner enables correction corresponding to distortion of the foldable display device 196. In addition, image processing can be performed such that an image is displayed in accordance with the user's sight line and the shape of the foldable display device 196. The structure of FIGS. 9A and 9B does not need to eliminate the image data, though the elimination is required in the regions f and g of the structure of FIGS. 8A and 8B. The image data in a region at which the user does not look can be decimated, and the whole region of the image can be displayed.

Figure 10:
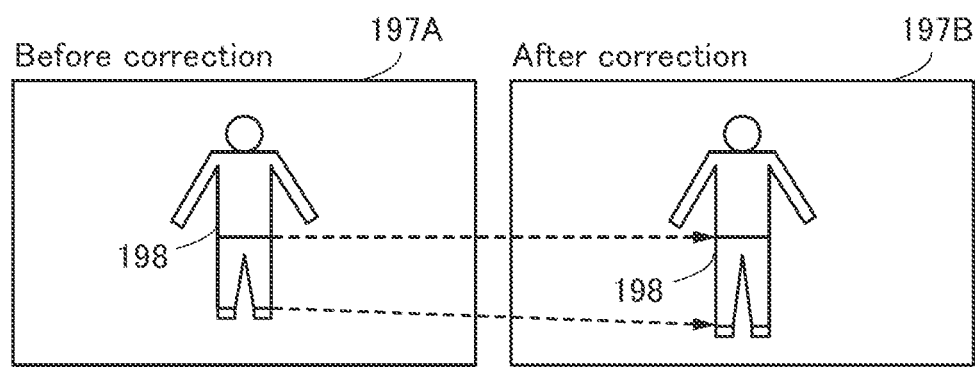
FIG. 10 shows a structure example of a display device according to an embodiment.

Image processing with variable clock signal frequencies can be performed not only for correction corresponding to distortion of the foldable display device 196 but also for other kinds of correction. FIG. 10 shows an image 197A before correction and an image 197B after correction. In this correction, only part of the image corresponding to the lower body of a person 198 is blown up.

Such image processing typically needs to be performed on a saved image with software; however, the use of the data conversion circuit 100 of FIG. 1 and the data conversion circuit 140 of FIG. 4 enables such image processing to be performed with hardware. Thus, at the time of taking an image, it is possible to perform image processing desired by a user on a real time basis and take the image.

Embodiment 3

In this embodiment, cross-sectional structure examples of a display device of one embodiment of the present invention will be described with reference to drawings.

Structure Example of Display Device

Figure 11:
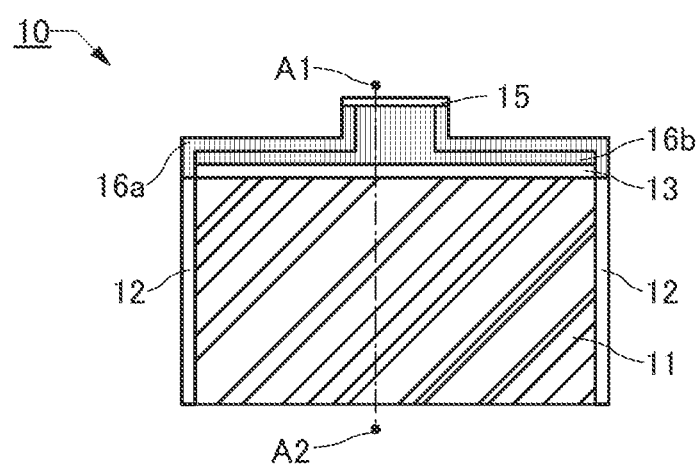
FIG. 11 shows a structure example of a display device according to an embodiment.

FIG. 11 is a schematic top view of a display device 10 described below. The display device 10 includes a pixel portion 11, a scan line driver circuit 12, a signal line driver circuit 13, a terminal portion 15, a plurality of wirings 16a, a plurality of wirings 16b, and the like.

Cross-Sectional Structure Example 1

Figure 12:
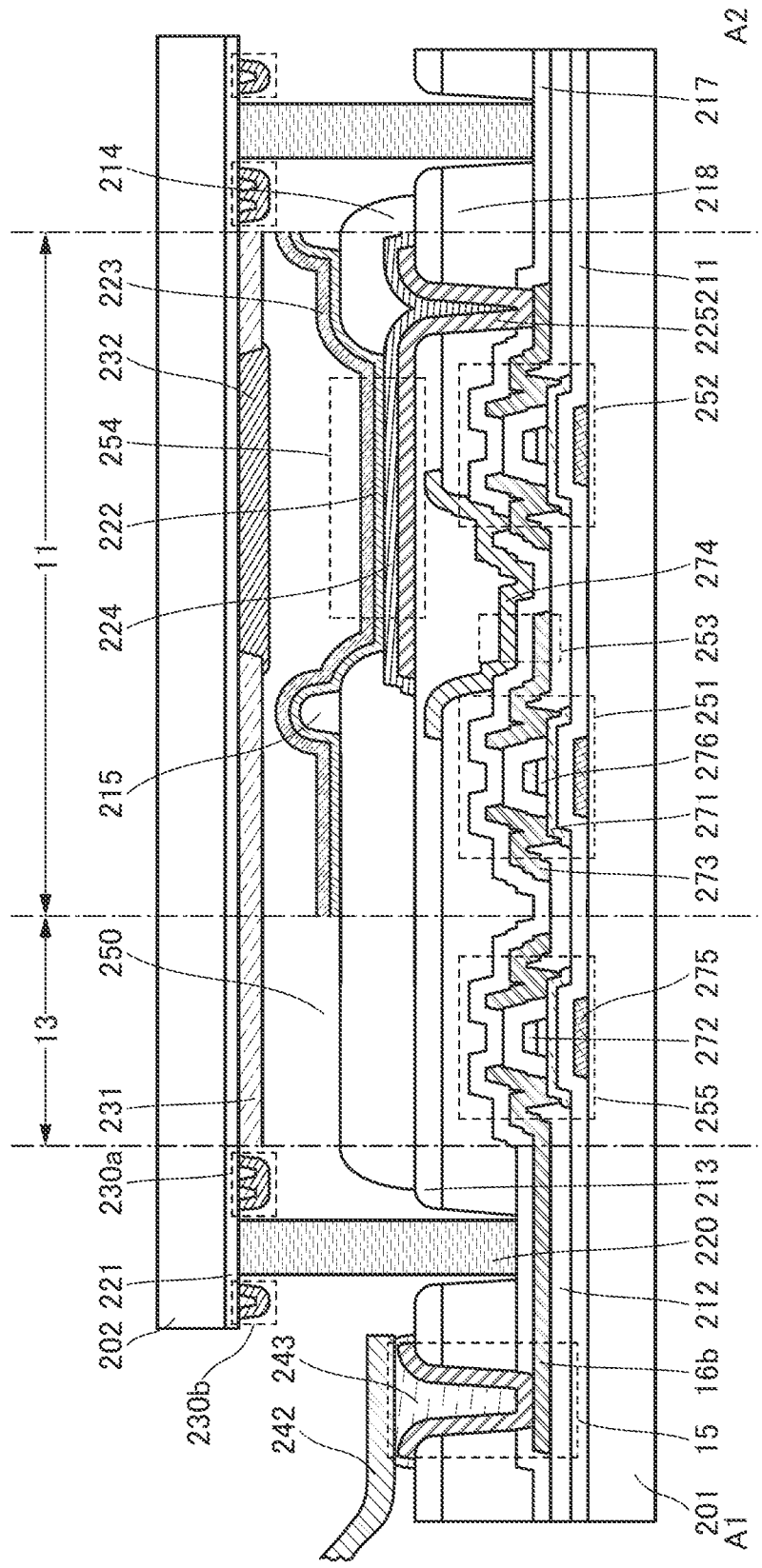
FIG. 12 shows a structure example of a display device according to an embodiment.

FIG. 12 is a schematic cross-sectional view of the display device 10. FIG. 12 shows a cross section taken along the section line A1-A2 of FIG. 11.

The display device 10 includes a first substrate 201 and a second substrate 202 which are bonded to each other with a bonding layer 220.

Provided over the first substrate 201 are: the terminal portion 15; the wiring 16b; a transistor 255 that is included in the signal line driver circuit 13; transistors 251 and 252, a capacitor 253, and a light-emitting element 254 that are included in the pixel portion 11; and the like. In addition, insulating layers 211, 212, 213, and 214, a spacer 215, and the like are provided over the first substrate 201.

An insulating layer 221, a light-blocking layer 231, a coloring layer 232, structures 230a and 230b, and the like are provided on the first substrate 201 side of the second substrate 202.

The light-emitting element 254 is provided over the insulating layer 213. The light-emitting element 254 includes a pixel electrode 225 serving as a first electrode, an EL layer 222, and a second electrode 223. An optical adjustment layer 224 is provided between the pixel electrode 225 and the EL layer 222. The insulating layer 214 covers end portions of the pixel electrode 225 and the optical adjustment layer 224.

The transistors 251 and 252 are the transistors included in the pixel 191 of Embodiment 1. The transistor 255 is the transistor included in the shift register 181 of Embodiment 1.

The transistors 251, 252, and 255 are each provided with a conductive layer 275 functioning as a first gate electrode and a conductive layer 272 functioning as a second gate electrode. Specifically, a semiconductor in which a channel is formed is sandwiched between the two gate electrodes.

When the conductive layer 275 is an electrode that releases oxygen that can fill oxygen vacancies in the semiconductor layer 271, the electrical characteristics of the transistors can be stable.

In the transistor connected to a light-emitting element, like the transistor 252, two gate electrodes are preferably electrically connected to each other so as to be supplied with the same signal. Such a transistor can have higher field-effect mobility and thus have higher on-state current than other transistors. Consequently, a circuit capable of high-speed operation can be obtained.

Although the capacitor 253 is formed of part of a conductive layer 274, part of an insulating layer 217, and part of a conductive layer 273 in FIG. 12, the capacitor 253 can be formed of part of the conductive layer 275, part of the insulating layer 211, and part of the semiconductor layer 271.

The light-emitting element 254 in the example illustrated in FIG. 12 is a top-emission light-emitting element. Light emission from the light-emitting element 254 is extracted from the second substrate 202 side. Such a structure enables transistors, capacitors, circuits, wirings, and the like to be provided below the light-emitting element 254 (i.e., on the first substrate 201 side), leading to an increase in the aperture ratio of the pixel portion 11.

The coloring layer 232 overlapping with the light-emitting element 254 is provided on the surface of the second substrate 202 on the first substrate 201 side. The light-blocking layer 231 may be provided in a region where the coloring layer 232 is not provided. The light-blocking layer 231 may overlap with the signal line driver circuit 13 as illustrated in FIG. 12. In addition, a light-transmitting overcoat layer may be provided to cover the coloring layer 232 and the light-blocking layer 231.

On the first substrate 201 side of the second substrate 202, the structure 230a is provided in a region interior to the bonding layer 220, and the structure 230b is provided in a region exterior to the bonding layer 220. The structures 230a and 230b each have a function of inhibiting development of a crack in the insulating layer 221, the second substrate 202, or the like at the end portions of the second substrate 202. The structures 230a and 230b in the example of FIG. 12 have layered structures including a layer formed of the same film as the light-blocking layer 231 and a layer formed of the same film as the coloring layer 232. Such a stacked structure of more than two films can heighten the effect of inhibiting crack development. Although the structures 230a and 230b are on both sides of the bonding layer 220, either one of the structures 230a and 230b may be provided on one side of the bonding layer 220. When there is no possibility of cracks (e.g., when the second substrate 202 possesses high stiffness), the structures 230a and 230b may be omitted.

The spacer 215 is provided over the insulating layer 214. The spacer 215 serves as a gap spacer for preventing the distance between the first substrate 201 and the second substrate 202 from excessively decreasing. The angle between part of the side surface of the spacer 215 and the surface where the spacer 215 is formed is preferably more than or equal to 45° and less than or equal to 120°, more preferably more than or equal to 60° and less than or equal to 100°, still more preferably more than or equal to 75° and less than or equal to 90°. In that case, the thickness of the EL layer 222 on the side surface of the spacer 215 can be reduced with ease. This can prevent undesired emission due to a current that flows through the EL layer 222 between adjacent light-emitting elements. Providing the spacer 215 having such a shape between light-emitting elements is effective particularly when the pixel portion 11 has high definition and the distance between adjacent light-emitting elements is short. Furthermore, such provision of the spacer 215 is effective particularly when the EL layer 222 includes a layer containing a highly conductive material, for example.

In the case where a blocking mask is used in the formation of the EL layer 222, the second electrode 223, and the like, the spacer 215 may have a function of protecting the formation surface from being flawed by the blocking mask.

The spacer 215 preferably overlaps with a wiring which intersects with a scan line.

A color filter method is used for the display device 10 shown in FIG. 12. For example, subpixels of three colors with the coloring layers 232 of red (R), green (G), and blue (B) may express one color. In addition, subpixels of white (W) and yellow (Y) are preferably used because such additional subpixels can improve the color reproducibility and reduce power consumption.

Owing to the combination of the coloring layer 232 and a microcavity structure using the optical adjustment layer 224 in the light-emitting element 254, light with high color purity can be extracted from the display device 10. The thickness of the optical adjustment layer 224 is determined in accordance with the color of a subpixel. Certain subpixels may have no optical adjustment layer.

An EL layer that emits white light is preferably used as the EL layer 222 of the light-emitting element 254. The use of the light-emitting element 254 that emits white light eliminates the need of separately coloring the EL layers 222 of the subpixels, which leads to a reduction in cost and an increase in yield. In addition, the pixel portion 11 can be easily formed to have high resolution. The subpixels may include optical adjustment layers having different thicknesses. The EL layers 222 in the subpixels may be separately colored, in which case one or both of the optical adjustment layer and the coloring layer can be omitted. In that case, layers in the subpixels are not necessarily colored separately except light-emitting layers of the EL layers 222.

In the example shown in FIG. 12, an FPC 242 is electrically connected to the terminal portion 15. Thus, the display device 10 shown in FIG. 12 can be referred to as a display module. Note that a display device without an FPC and the like can be referred to as a display panel.

The terminal portion 15 is electrically connected to the FPC 242 through a connection layer 243.

The terminal portion 15 shown in FIG. 12 has a layered structure including the wiring 16b and a conductive layer formed of the same conductive film as the pixel electrode 225. The terminal portion 15 preferably has such a layered structure including a plurality of conductive layers, which can reduce electric resistance and increase mechanical strength.

A material in which impurities such as water or hydrogen do not easily diffuse is preferably used for the insulating layer 211 and the insulating layer 221. That is, the insulating layer 211 and the insulating layer 221 can each function as a barrier film. The insulating layers 211 and 221 with such a structure can effectively inhibit entry of impurities from the outside into the light-emitting element 254, the transistors, and the like even when a moisture-permeable material is used for the first substrate 201 and the second substrate 202; thus, the display device can have high reliability.

The example in FIG. 12 illustrates a sealed hollow structure including a space 250 between the first substrate 201 and the second substrate 202. For example, the space 250 may be filled with an inert gas, such as nitrogen or a rare gas. The space 250 may be filled with a fluid material such as oil. The pressure in the space 250 may be reduced. The sealing method is not limited to hollow sealing, and solid sealing that utilizes a resin to fill the space may be used.

Cross-Sectional Structure Example 2

Figure 13:
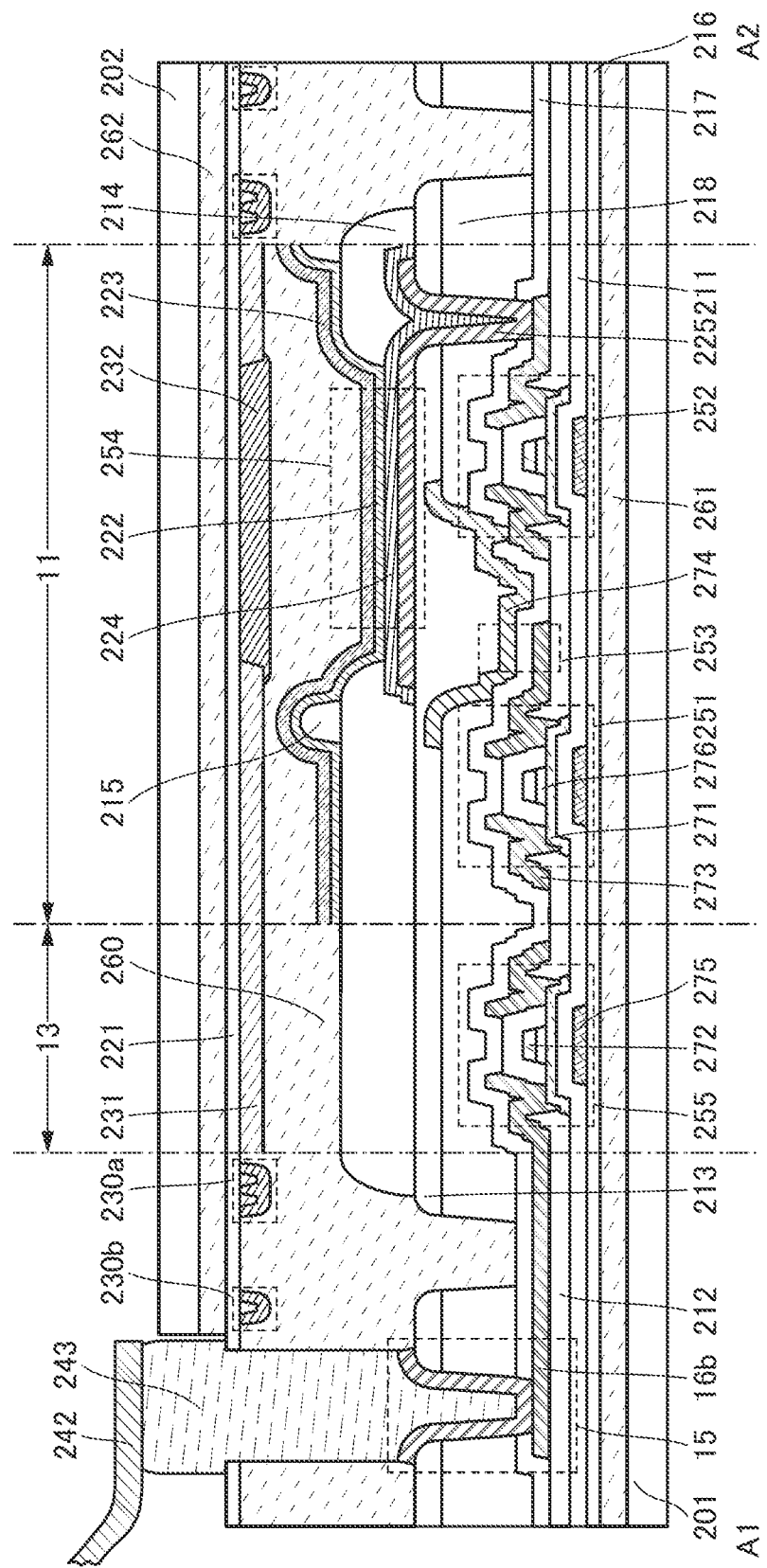
FIG. 13 shows a structure example of a display device according to an embodiment.

FIG. 13 is a structure example of a display device which is suitable when the pixel portion 11 and the signal line driver circuit 13 are used in a state of being bent.

The display device 10 shown in FIG. 13 has a solid sealing structure in which the first substrate 201 and the second substrate 202 are bonded to each other with a sealant 260.

A bonding layer 261 is provided over the first substrate 201. An insulating layer 216 is provided over the bonding layer 261. A transistor, a light-emitting element, and the like are provided over the insulating layer 216. The insulating layer 216 can include a material through which impurities such as water or hydrogen do not easily diffuse, similarly to the insulating layer 221.

A bonding layer 262 is provided between the second substrate 202 and the insulating layer 221.

As shown in FIG. 13, the insulating layer 213 has an opening located in a portion closer to the outer end of the first substrate 201 than the pixel portion 11 and the signal line driver circuit 13. The insulating layer 213 formed using a resin material, for example, preferably has an opening that surrounds the pixel portion 11, the signal line driver circuit 13, and the like. In such a structure, part of the insulating layer 213 whose side surface is exposed to the outside is discontinuous with another part of the insulating layer 213 that overlaps with the pixel portion 11, the signal line driver circuit 13, and the like; thus, diffusion of impurities, such as water and hydrogen, from the outside through the insulating layer 213 can be inhibited.

The solid sealing structure shown in FIG. 13 makes it easier to keep the distance between the first substrate 201 and the second substrate 202 constant. Thus, flexible substrates can be suitably used as the first substrate 201 and the second substrate 202. As a result, part of or the whole of the pixel portion 11, the scan line driver circuit 12, and the signal line driver circuit 13 can be bent when used. For example, the display device 10 can be bonded to a curved surface or the pixel portion of the display device 10 can be folded, which allows electronic devices to have a variety of structures.

Modification Example

An example of a touch panel including a touch sensor will be described below.

FIG. 14 shows an example of a touch panel in which an on-cell touch sensor is used in the structure shown as an example in FIG. 12.

Over the second substrate 202, a conductive layer 291 and a conductive layer 292 are covered with an insulating layer 294. A conductive layer 293 is provided over the insulating layer 294. The conductive layer 293 is electrically connected, in an opening of the insulating layer 294, to two conductive layers 292 between which the conductive layer 291 is provided. The insulating layer 294 is bonded to a substrate 296 with a bonding layer 295.

The capacitance formed between the conductive layers 291 and 292 changes with the approach of an object, so that the approach or contact of the object can be sensed. Lattice arrangement of the plurality of conductive layers 291 and the plurality of conductive layers 292 enables acquisition of location information.

A terminal portion 299 is provided in the vicinity of the outer end of the second substrate 202. The terminal portion 299 is electrically connected to an FPC 297 through a connection layer 298.

The substrate 296 here can be used as a substrate with which an object, such as a finger or a stylus, is to be in contact. In that case, a protective layer (such as a ceramic coat) is preferably provided over the substrate 296. The protective layer can be formed using an inorganic insulating material such as silicon oxide, aluminum oxide, yttrium oxide, or yttria-stabilized zirconia (YSZ). A tempered glass may be used for the substrate 296. Physical or chemical processing by an ion exchange method, a wind tempering method, or the like may be performed on the tempered glass so that compressive stress is applied on the surface. In the case where the touch sensor is provided on one side of the tempered glass and the opposite side of the tempered glass is used as a touch surface that is on the outermost surface of an electronic device, the thickness of the whole device can be decreased.

As the touch sensor, a capacitive touch sensor can be used. Examples of the capacitive touch sensor are a surface capacitive touch sensor and a projected capacitive touch sensor. Examples of the projected capacitive touch sensor include a self-capacitive touch sensor and a mutual capacitive touch sensor. The use of a mutual capacitive touch sensor is preferable because multiple points can be sensed simultaneously. An example of using a projected capacitive touch sensor will be described below.

Note that one embodiment of the present invention is not limited to this example, and any of a variety of sensors capable of sensing the approach or contact of an object, such as a finger or a stylus, can be used.

Although the above example shows an on-cell touch panel in which a wiring and the like composing a touch sensor are formed on the outer surface of the second substrate 202, the structure of the touch panel is not limited thereto. For example, an external (out-cell) touch panel or an in-cell touch panel can be employed. A display panel serving as a touch panel can have a small thickness when the touch panel has the on-cell or in-cell structure.

The above is the description of the cross-sectional structure examples.

[Components]

The above-mentioned components will be described below.

[Substrate]

A substrate having a flat surface can be used as the substrate included in the display device. The substrate on the side from which light from the light-emitting element is extracted is formed using a material which transmits the light. For example, a material such as glass, quartz, ceramic, sapphire, or an organic resin can be used.

The weight and thickness of the display device can be decreased by using a thin substrate. Furthermore, a flexible display device can be obtained by using a substrate that is thin enough to have flexibility.

Examples of glass include alkali-free glass, barium borosilicate glass, aluminoborosilicate glass, and the like.

Examples of materials having flexibility and a visible-light-transmitting property include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is light in weight, and thus, a display device using this substrate can also be light in weight.

For the substrate through which light emission is not extracted, which does not need to have a light-transmitting property, a metal substrate or the like can be used in addition to the above-mentioned substrates. A metal substrate, which has high thermal conductivity, is preferable because it can easily conduct heat to the whole substrate and accordingly can prevent a local temperature rise in the display device.

Although there is no particular limitation on a material of a metal substrate, it is favorable to use, for example, a metal such as aluminum, copper, or nickel, an aluminum alloy, or an alloy such as stainless steel.

It is preferable to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

A hard coat layer (e.g., a silicon nitride layer) by which a surface of the display device is protected from damage, a layer (e.g., an aramid resin layer) that can disperse pressure, or the like may be stacked over the flexible substrate. Furthermore, to suppress a decrease in the lifetime of the light-emitting element due to moisture and the like, an insulating film with low water permeability may be stacked over the flexible substrate. For example, an inorganic insulating material such as silicon nitride, silicon oxynitride, aluminum oxide, or aluminum nitride can be used.

The substrate may be formed by stacking a plurality of layers. In particular, when a glass layer is used, a barrier property against water and oxygen can be improved, and thus, a highly reliable display device can be provided. For example, a substrate in which a glass layer, an bonding layer, and an organic resin layer are stacked in this order from the side closer to a light-emitting element can be used. Providing such an organic resin layer, occurrence of a crack or a break in the glass layer can be suppressed and mechanical strength can be improved. With the substrate that includes such a composite material of a glass material and an organic resin, a highly reliable flexible display device can be provided.

[Transistor]

The transistor included in the display device includes a conductive layer functioning as a front gate electrode, a conductive layer functioning as a back gate electrode, a semiconductor layer, a conductive layer functioning as a source electrode, a conductive layer functioning as a drain electrode, and an insulating layer functioning as a gate insulating layer.

That is, in the transistor included in the display device of one embodiment of the present invention, gate electrodes are provided over and under a channel. However, the structure is note limited thereto, and a single gate structure, which includes a gate over or under the channel, may be employed.

There is no particular limitation on the crystallinity of a semiconductor material used for the transistor, and an amorphous semiconductor or a crystalline semiconductor (a microcrystalline semiconductor, a polycrystalline semiconductor, a single crystal semiconductor, or a semiconductor partly including crystal regions) may be used. A crystalline semiconductor is preferably used, in which case deterioration of the transistor characteristics can be suppressed.

As a semiconductor material used for the semiconductor layer of the transistor, an oxide semiconductor can be used, for example. In particular, an oxide semiconductor having a wider band gap than silicon is preferably used. A semiconductor material having a wider band gap and a lower carrier density than silicon is preferably used, in which case off-state current of the transistor can be reduced.

For example, the oxide semiconductor preferably contains at least indium (In) or zinc (Zn). More preferably, the oxide semiconductor contains In-M-Zn-based oxide (M is a metal such as Al, Ti, Ga, Ge, Y, Zr, Sn, La, Ce, or Hf).

As the semiconductor layer, it is particularly preferable to use an oxide semiconductor layer including a plurality of crystal parts whose c-axes are aligned substantially perpendicularly to a surface on which the semiconductor layer is formed or the top surface of the semiconductor layer and in which a grain boundary is not observed between adjacent crystal parts.

There is no grain boundary in such oxide semiconductor; therefore, generation of a crack in the oxide semiconductor layer which is caused by stress when a display panel is bent is prevented. Therefore, such an oxide semiconductor can be preferably used for a flexible display device which is used in a bent state, or the like.

Moreover, the use of such an oxide semiconductor with crystallinity for the semiconductor layer makes it possible to provide a highly reliable transistor in which a change in the electrical characteristics is suppressed.

A transistor with an oxide semiconductor whose band gap is wider than that of silicon has a low off-state current; therefore, electric charge stored in a capacitor that is series-connected to the transistor can be held for a long time. The use of such a transistor in pixels allows a driver circuit to stop while the gray level of an image displayed in display regions is maintained. As a result, a display device with extremely low power consumption can be obtained.

[Conductive Layer]

As materials for a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because it increases controllability of shape processing by etching.

As a light-transmitting material that can be used for conductive layers such as wirings and electrodes in the display device, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). In the case of using the metal material or the alloy material (or the nitride thereof), the film thickness is set small enough to transmit light. Alternatively, a stacked film of any of the above materials can be used for the conductive layers. For example, a stacked film of indium tin oxide and an alloy of silver and magnesium is preferably used because it can increase the conductivity.

[Insulating Layer]

As an insulating material that can be used for the insulating layers, the overcoat, the spacer, and the like, a resin such as acrylic or epoxy, a resin having a siloxane bond such as a silicone resin, or an inorganic insulating material such as silicon oxide, silicon oxynitride, silicon nitride oxide, silicon nitride, or aluminum oxide can be used.

The light-emitting element is preferably provided between a pair of insulating films with low water permeability, in which case impurities such as water can be prevented from entering the light-emitting element. Thus, a decrease in device reliability can be prevented.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the amount of the moisture vapor transmission of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

[Bonding Layer, Sealant]

As the bonding layer and the sealant, a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering a functional element, thereby improving the reliability of the display panel.

In addition, a filler with a high refractive index or a light-scattering member may be mixed into the resin, in which case the efficiency of light extraction from the light-emitting element can be improved. For example, titanium oxide, barium oxide, zeolite, zirconium, or the like can be used.

[Light-Emitting Element]

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region that contains the same material as the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

For the conductive film that transmits visible light, for example, indium oxide, indium tin oxide (ITO), indium zinc oxide, zinc oxide, or zinc oxide to which gallium is added can be used. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin enough to have a light-transmitting property. Alternatively, a multi-layer film of any of the above materials can be used for the conductive layer. For example, a multi-layer film of ITO and an alloy of silver and magnesium is preferably used because it can increase the conductivity. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy), such as an alloy of aluminum and titanium, an alloy of aluminum and nickel, or an alloy of aluminum and neodymium, or an alloy containing silver, such as an alloy of silver and copper, an alloy of silver, palladium, and copper, or an alloy of silver and magnesium can be used for the conductive film. An alloy containing silver and copper is preferable because of its high heat resistance. Furthermore, when a metal film or a metal oxide film is stacked on and in contact with an aluminum alloy film, oxidation of the aluminum alloy film can be prevented. Examples of materials for the metal film or the metal oxide film include titanium and titanium oxide. Alternatively, the above conductive film that transmits visible light and a film containing a metal material may be stacked. For example, a multi-layer film of silver and ITO or a stacked film of an alloy of silver and magnesium and ITO can be used.

The conductive layers may each be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, or a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Coloring Layer]

As examples of a material that can be used for the coloring layers, a metal material, a resin material, and a resin material containing a pigment or dye can be given.

[Light-Blocking Layer]

Examples of a material that can be used for the light-blocking layer include carbon black, a metal oxide, and a composite oxide containing a solid solution of a plurality of metal oxides. A multi-layer film containing the materials of the coloring layers can also be used for the light-blocking layer. For example, a multi-layer structure of a film containing a material of a coloring layer which transmits light of a certain color and a film containing a material of a coloring layer which transmits light of another color can be employed. The coloring layer and the light-blocking layer are preferably formed using the same material, in which case the same manufacturing apparatus can be used and the process can be simplified.

[Connection Layer]

As the connection layer connecting a terminal to an FPC or IC, an anisotropic conductive film (ACF), an anisotropic conductive paste (ACP), or the like can be used.

The above is the description of each of the components.

At least part of this embodiment can be implemented in combination with any of the other embodiments described in this specification as appropriate.

Embodiment 4

In this embodiment, an example of a manufacturing method of a display device including a flexible substrate will be described.

Here, layers including a light-emitting element, a circuit, a wiring, an electrode, an insulating layer, an optical member such as a coloring layer or a light-blocking layer, and the like are collectively referred to as an element layer. The element layer includes, for example, a light-emitting element, and may additionally include a wiring electrically connected to the light-emitting element or an element such as a transistor used in a pixel or a circuit.

In addition, a flexible member which supports the element layer at the completion of the light-emitting element (at the completion of the manufacturing process) is referred to as a substrate. For example, the substrate may be an extremely thin film with a thickness greater than or equal to 10 nm and less than or equal to 300 μm or the like.

The following two methods are typically used to form an element layer over a flexible substrate having an insulating surface. One of the methods is to directly form an element layer over a flexible substrate. The other method is to form an element layer over a supporting base that is different from a flexible substrate and then to separate the element layer from the supporting base to transfer the element layer to the substrate. Although not described in detail here, a method in which an element layer is formed over a substrate with no flexibility and the substrate is then thinned by polishing or the like to have flexibility is available in addition to the above two methods.

In the case where a material of the substrate can withstand heating temperature in a process for forming the element layer, the element layer is preferably formed directly over the substrate so that a manufacturing process can be simplified. In that case, it is preferable to form the element layer over the substrate that is fixed to a supporting base, in which case the transfer in an apparatus and between apparatuses is facilitated.

In the case of employing the method in which the element layer is formed over the supporting base and then transferred to the substrate, first, a separation layer and an insulating layer are stacked over the supporting base, and then the element layer is formed over the insulating layer. Next, the element layer is separated from the supporting base and then transferred to the substrate. Here, a material is selected that would cause separation at an interface between the supporting base and the separation layer, at an interface between the separation layer and the insulating layer, or in the separation layer. In the method, it is preferred that a material having high heat resistance be used for the supporting base or the separation layer, in which case the upper limit of the temperature applied when the element layer is formed can be heightened and an element layer including a more reliable element can be formed.

For example, a multi-layer film of a layer containing a high-melting-point metal material, such as tungsten, and a layer containing an oxide of the metal material is used as the separation layer. Furthermore, a plurality of layers including any of a silicon oxide layer, a silicon nitride layer, a silicon oxynitride layer, a silicon nitride oxide layer, and the like are preferably stacked to be used as the insulating layer over the separation layer. Note that in this specification, oxynitride refers to a material whose oxygen content is higher than the nitrogen content, and nitride oxide refers to a material whose nitrogen content is higher than the oxygen content.

The element layer and the supporting base can be separated by applying mechanical power, by etching the separation layer, or by injecting a liquid into the separation interface, for example. Alternatively, separation may be performed by heating or cooling two layers between which the separation interface exists, by utilizing a difference in thermal expansion coefficient.

At the start of separation, it is preferable that a separation trigger be formed first so that the separation proceeds from the trigger. The separation trigger can be formed, for example, by locally heating part of the insulating layer or the separation layer with laser light or the like or by physically cutting or making a hole through part of the insulating layer or the separation layer with a sharp tool.

The separation layer is not necessarily provided in the case where separation can occur at an interface between the supporting base and the insulating layer.

For example, when glass is used as the supporting base and an organic resin such as polyimide is used as the insulating layer, separation can be performed at the interface between the glass and the organic resin. The remaining organic resin such as polyimide can be used as the substrate.

Alternatively, a heat-generation layer may be provided between the supporting base and the insulating layer formed of an organic resin, and separation may be performed at the interface between the heat-generation layer and the insulating layer by heating the heat-generation layer. The heat-generation layer can be formed using a variety of materials such as a material that generates heat when current flows therethrough, a material that generates heat when it absorbs light, or a material that generates heat when it is applied with a magnetic field. For example, a semiconductor, a metal, or an insulator can be selected for the heat-generation layer.

Next, an example of a specific manufacturing method will be described. The manufacturing method described below enables fabrication of a flexible input/output device of one embodiment of the present invention by changing a layer formed as a layer subjected to separation.

Figure 15A:
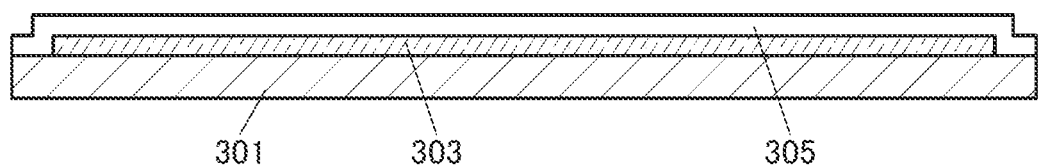
FIGS. 15A to 15D illustrate a method for manufacturing a display device according to an embodiment.
Figure 15B:
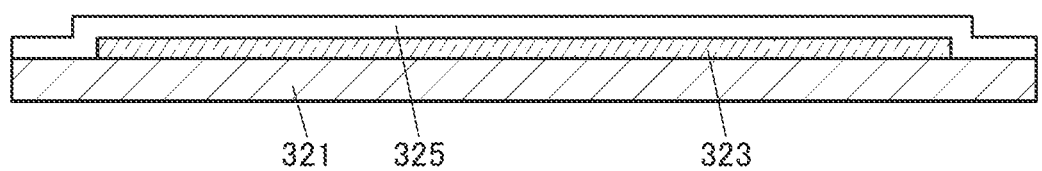

First, over a formation substrate 301, an island-shaped separation layer 303 is formed. Then, a layer 305 subjected to separation is formed over the separation layer 303 (FIG. 15A). In addition, an island-shaped separation layer 323 is formed over a formation substrate 321. Then, a layer 325 subjected to separation is formed over the separation layer 323 (FIG. 15B).

Although an example in which the separation layer is formed to have an island shape is described here, one embodiment of the present invention is not limited to this example. In this step, selected as the material for the separation layer is a material that allows separation at the interface between the formation substrate and the separation layer, the interface between the separation layer and the layer subjected to separation, or in the separation layer when the layer subjected to separation is separated from the formation substrate. Although an example in which separation occurs at the interface between the separation layer and the layer subjected to separation is described in this embodiment, a portion where the separation occurs is not limited to this example and depends on materials used for the separation layer and the layer subjected to separation. Note that in the case where the layer subjected to separation has a multi-layer structure, a layer in contact with the separation layer is particularly referred to as a first layer.

For example, when the separation layer has a multi-layer structure of a tungsten film and a tungsten oxide film and separation occurs at the interface between the tungsten film and the tungsten oxide film (or the vicinity of the interface), part of the separation layer (here, part of the tungsten oxide film) may remain on the layer subjected to separation. The separation layer remaining on the layer subjected to separation may be removed after separation.

As the formation substrate, a substrate having heat resistance high enough to withstand at least the process temperature in a manufacturing process is used. As the formation substrate, for example, a glass substrate, a quartz substrate, a sapphire substrate, a semiconductor substrate, a ceramic substrate, a metal substrate, a resin substrate, or a plastic substrate can be used.

When a glass substrate is used as the formation substrate, an insulating film such as a silicon oxide film, a silicon oxynitride film, a silicon nitride film, or a silicon nitride oxide film is preferably formed as a base film between the formation substrate and the separation layer, in which case contamination from the glass substrate can be prevented.

The separation layer can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The separation layer is preferably formed using a high-melting point metal material such as tungsten, titanium, or molybdenum, in which case the degree of freedom of the process for forming the layer subjected to separation can be increased.

The separation layer can be formed by, for example, a sputtering method, a plasma-enhanced CVD method, a coating method (including a spin coating method, a droplet discharging method, and a dispensing method), or a printing method. The thickness of the separation layer ranges from 10 nm to 200 nm, for example, and preferably from 20 nm to 100 nm.

As the separation layer having a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds, for example, to an alloy of tungsten and molybdenum.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Note that the separation layer is not necessary in the case where separation at the interface between the formation substrate and the layer subjected to separation is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is increased by laser light irradiation or heat treatment. Then, an insulating film, a transistor, and the like are formed over the organic resin. After that, laser light irradiation with higher energy density than the above laser light irradiation or heat treatment at a higher temperature than the above heat treatment is performed, so that separation at the interface between the formation substrate and the organic resin can be caused. The interface between the formation substrate and the organic resin may be soaked in a liquid to perform separation.

Since the insulating film, the transistor, and the like are formed over the organic resin having low heat resistance in the above method, it is impossible to expose the substrate to high temperatures in the manufacturing process. Note that a transistor using an oxide semiconductor is not necessarily processed at high temperatures and thus can be favorably formed over the organic resin.

The organic resin may be used for a substrate of the device. Alternatively, the organic resin may be removed and another substrate may be bonded to an exposed surface of the layer subjected to separation with the use of an adhesive. Alternatively, the organic resin may be bonded to another substrate (a supporting film) using an adhesive.

Alternatively, a metal layer may be provided between the formation substrate and the organic resin, and separation may be performed at the interface between the metal layer and the organic resin by heating the metal layer by current application thereto.

The insulating layer (the first layer) in contact with the separation layer preferably has a single-layer structure or a multi-layer structure including any of a silicon nitride film, a silicon oxynitride film, a silicon oxide film, a silicon nitride oxide film, and the like. Note that not limited thereto, an optimum material can be selected depending on a material used for the separation layer.

The insulating layer can be formed by a sputtering method, a plasma-enhanced CVD method, a coating method, a printing method, or the like. For example, the insulating layer is formed at temperatures ranging from 250° C. to 400° C. by a plasma-enhanced CVD method, whereby the insulating layer can be a dense film with high moisture resistance. Note that the thickness of the insulating layer is preferably greater than or equal to 10 nm and less than or equal to 3000 nm, further preferably greater than or equal to 200 nm and less than or equal to 1500 nm.

Figure 15C:
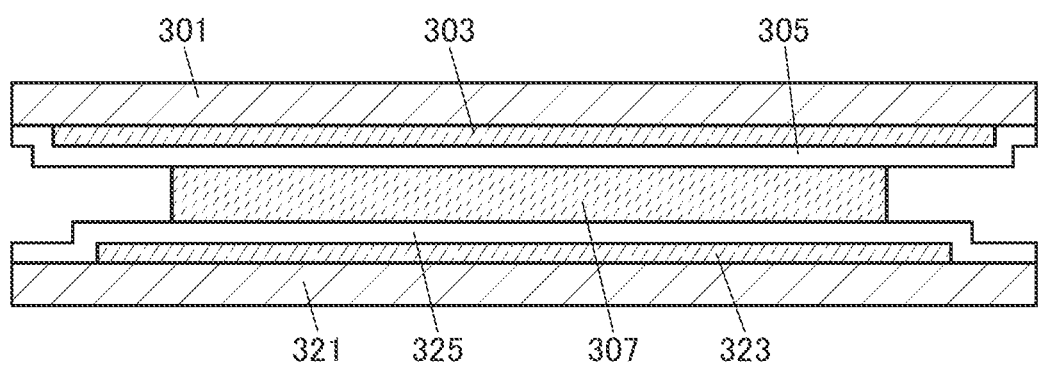

Next, the formation substrate 301 and the formation substrate 321 are attached to each other with a bonding layer 307 such that surfaces on which the layers subjected to separation are formed face each other, and the bonding layer 307 is cured (see FIG. 15C).

Note that the formation substrate 301 and the formation substrate 321 are preferably attached to each other in a reduced-pressure atmosphere.

Figure 15D:
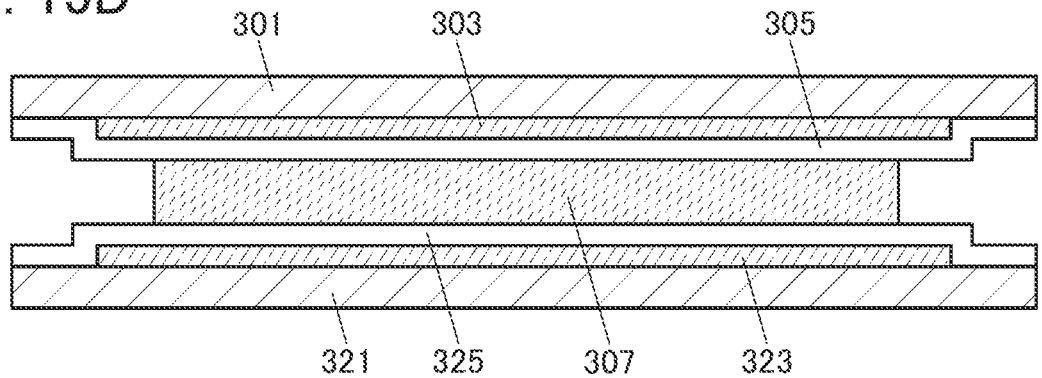

Although FIG. 15C illustrates the case where the separation layer 303 and the separation layer 323 have different sizes, the separation layers may have the same size as illustrated in FIG. 15D.

The bonding layer 307 is provided to overlap with the separation layer 303, the layer 305, the layer 325, and the separation layer 323. The edges of the bonding layer 307 are preferably positioned inside edges of at least one of the separation layer 303 and the separation layer 323 (the one intended to be separated first). This prevents strong adhesion between the formation substrate 301 and the formation substrate 321, thereby preventing a decrease in yield of a subsequent separation process.

As the bonding layer 307, various curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC resin, a PVB resin, and an EVA resin. In particular, a material with low moisture permeability, such as an epoxy resin, is preferred. For the adhesive, a material having fluidity low enough to dispose the material only in a desired region is preferably used. For example, an adhesive sheet, a bonding sheet, or a sheet-like or film-like adhesive can be used. For example, an optical clear adhesive (OCA) film can be favorably used.

The adhesive may have adhesion before attachment or exhibit adhesion by heating or light irradiation after attachment.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress deterioration of the functional element due to entry of moisture from the air and can improve the reliability of the device.

Figure 16A:
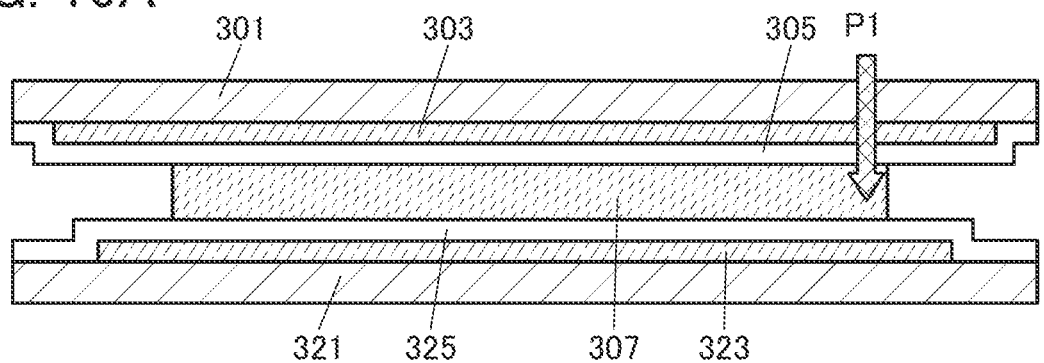
FIGS. 16A to 16D illustrate a method for manufacturing a display device according to an embodiment.
Figure 16B:
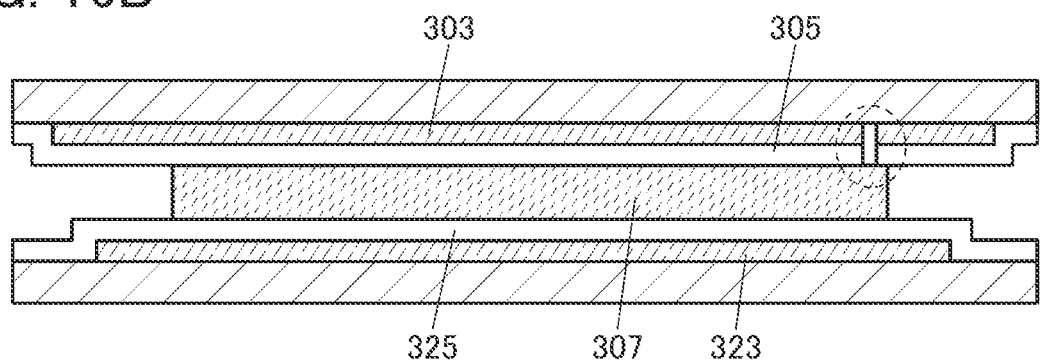

Subsequently, a separation trigger is formed by laser light irradiation (FIGS. 16A and 16B).

Either the formation substrate 301 or the formation substrate 321 may be separated first. In the case where the separation layers have different sizes, a substrate over which the larger separation layer is formed may be peeled first or a substrate over which the smaller separation layer is formed may be peeled first. In the case where an element such as a semiconductor element or a light-emitting element is formed only over one of the substrates, the substrate on the side where the element is formed may be separated first or the other substrate may be separated first. Here, an example in which the formation substrate 301 is separated first is described.

A region where the cured bonding layer 307, the layer 305, and the separation layer 303 overlap with one another is irradiated with laser light (see the arrow P1 in FIG. 16A).

Part of the first layer is removed; thus, the separation trigger can be formed (see a region surrounded by a dotted line in FIG. 16B. At this time, not only the first layer but also the separation layer 303, the bonding layer 307, or another layer included in the layer 305 may be partly removed.

It is preferable that laser light irradiation be performed from the substrate side where the separation layer that is to be separated is provided. In the case where a region where the separation layer 303 and the separation layer 323 overlap with each other is irradiated with laser light, the formation substrate 301 and the separation layer 303 can be selectively separated from each other by cracking only the layer 305 of the layers 305 and 325 (see a region surrounded by the dotted line in FIG. 16B). Here, an example in which layers of the layer 305 are partly removed is shown.

Figure 16C:
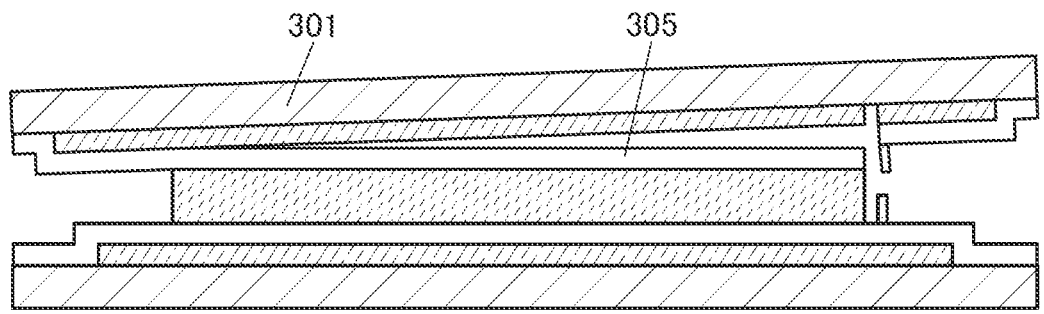
Figure 16D:
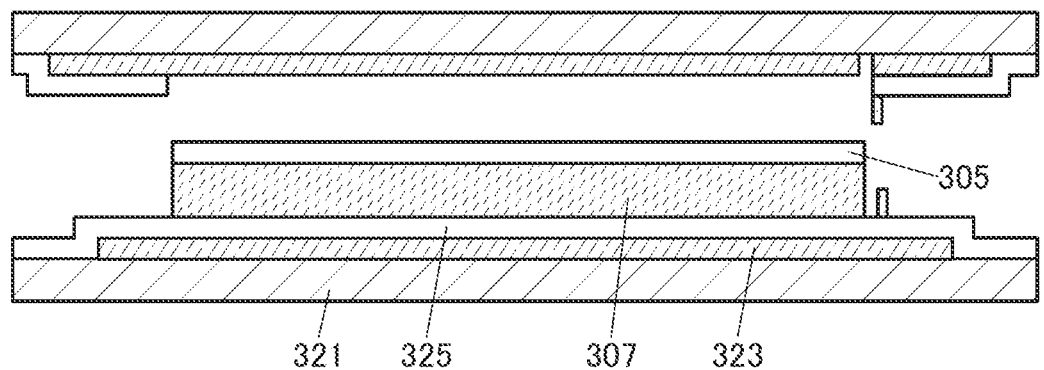

Then, the layer 305 and the formation substrate 301 are separated from each other from the separation trigger (FIGS. 16C and 16D). Thus, the layer 305 can be transferred from the formation substrate 301 to the formation substrate 321.

For example, the layer 305 and the formation substrate 301 may be separated from the separation trigger by mechanical force (e.g., a separation process with a human hand or a gripper, or a separation process by rotation of a roller).

The formation substrate 301 and the layer 305 may be separated while a liquid such as water wets the interface between the separation layer 303 and the layer 305. A portion between the separation layer 303 and the layer 305 is filled with a liquid through capillarity action, so that the separation layer 303 can be separated easily. Furthermore, an adverse effect of static electricity caused at separation on the functional element included in the layer 305 (e.g., damage to a semiconductor element from static electricity) can be reduced.

Figure 17A:
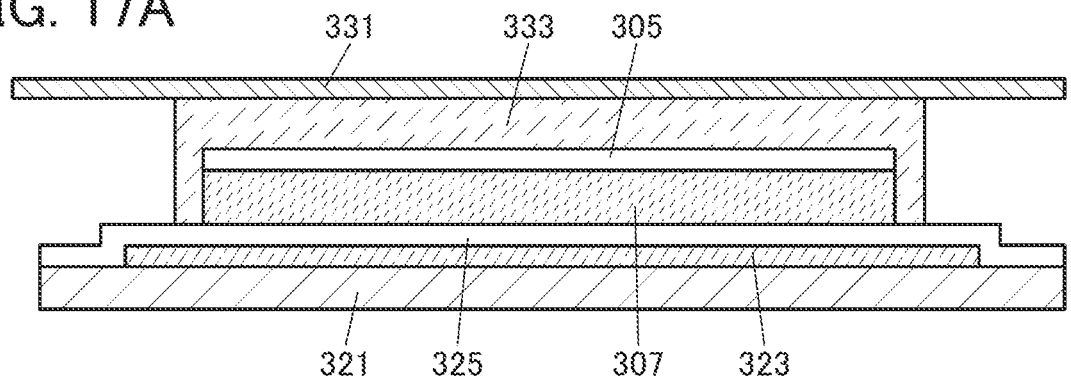
FIGS. 17A to 17D illustrate a method for manufacturing a display device according to an embodiment.

Next, the exposed layer 305 is attached to a substrate 331 with a bonding layer 333, and the bonding layer 333 is cured (FIG. 17A).

Note that the layer 305 and the substrate 331 are preferably attached to each other in a reduced-pressure atmosphere.

Figure 17B:
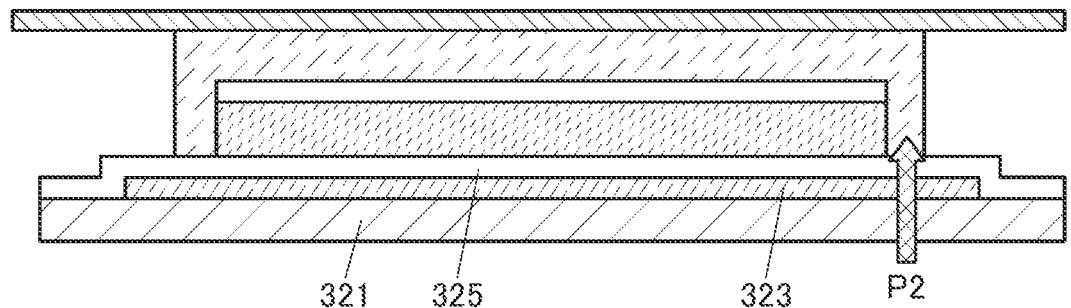
Figure 17C:
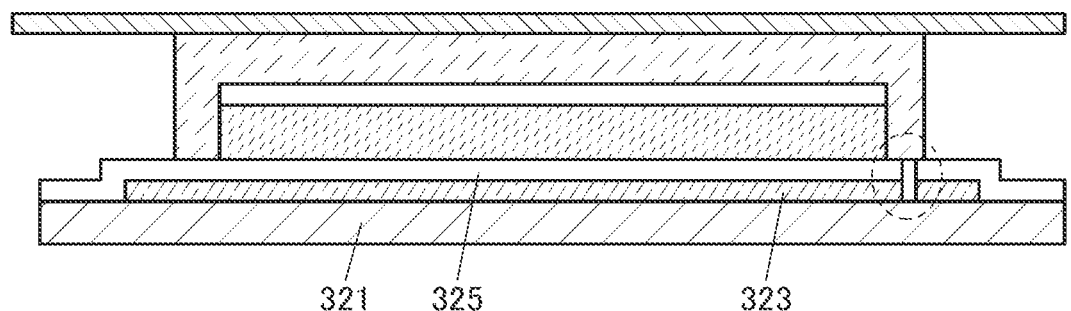

Next, a separation trigger is formed by laser light irradiation (FIGS. 17B and 17C).

A region where the cured bonding layer 333, the layer 325, and the separation layer 323 overlap with each other is irradiated with laser light (see an arrow P2 in FIG. 17B). Part of the first layer is removed; thus, the separation trigger can be formed (see a region surrounded by a dotted line in FIG. 17C. Here, an example in which layers of the layer 325 are partly removed is shown). At this time, not only the first layer but also the separation layer 323, the bonding layer 333, or another layer included in the layer 325 may be partly removed.

Laser light is preferably applied toward the formation substrate 321 provided with the separation layer 323.

Figure 17D:
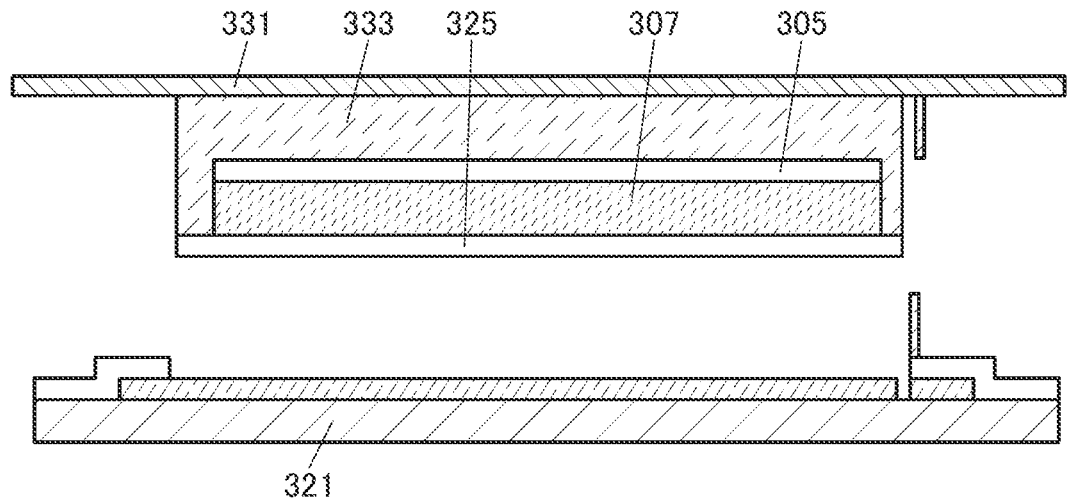

Then, the layer 325 and the formation substrate 321 are separated from each other from the separation trigger (see FIG. 17D). Accordingly, the layer 305 and the layer 325 can be transferred to the substrate 331.

After that, another substrate may be bonded to the layer 325.

Figure 18A:
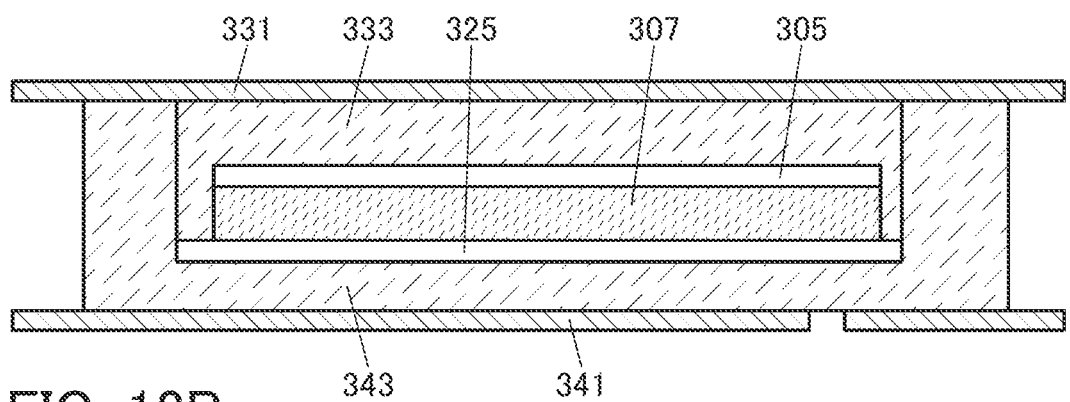
FIGS. 18A and 18B illustrate a method for manufacturing a display device according to an embodiment.

The exposed layer 325 is attached to a substrate 341 with a bonding layer 343, and the bonding layer 343 is cured (FIG. 18A). FIG. 18A shows an example in which an opening has been already provided in the substrate 341.

In this manner, the layer subjected to separation can be sandwiched between a pair of flexible substrates.

Figure 18B:
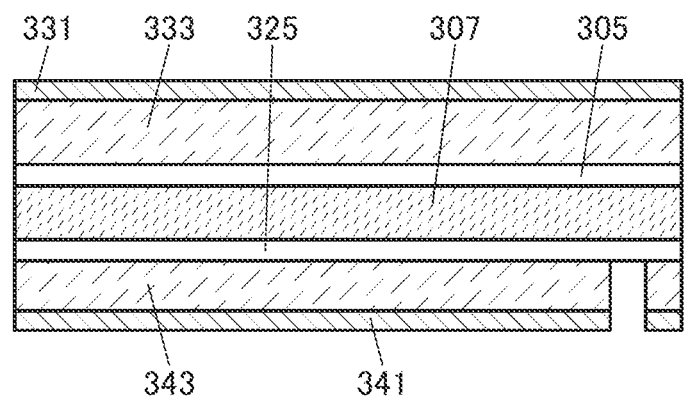

After that, unnecessary end portions of the substrate 331, the substrate 341, and the like may be cut and removed as shown in FIG. 18B. Part of the end portions of the layers 305 and 325 may be cut at the same time.

By the above method, a flexible device can be fabricated. When the layer subjected to separation has the structure described in the above embodiments, a flexible display device can be fabricated.

In the above method for manufacturing the display device of one embodiment of the present invention, a pair of formation substrates each provided with a separation layer and a layer subjected to separation are attached to each other, and then a separation trigger is formed by laser light irradiation to make separation of the layer subjected to separation from the separation layer easier; after that, separation is performed. This can improve the yield in the separation process.

In addition, separation is performed after the formation substrates each provided with the layer subjected to separation are attached to each other in advance, and then a substrate with which a device is intended to be formed can be attached to the layers subjected to separation. Thus, to attach the layers subjected to separation to each other, formation substrates having low flexibility can be attached to each other; thus, alignment accuracy at the time of attachment can be improved as compared to the case where flexible substrates are attached to each other.

Figure 19A:
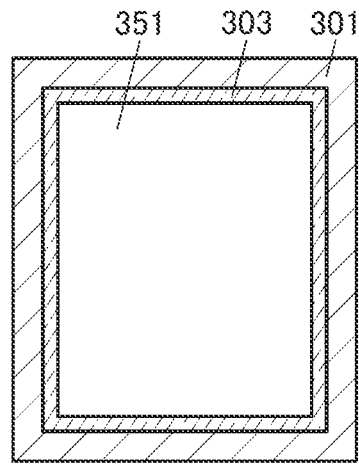
FIGS. 19A to 19C illustrate a method for manufacturing a display device according to an embodiment.
Figure 19B:
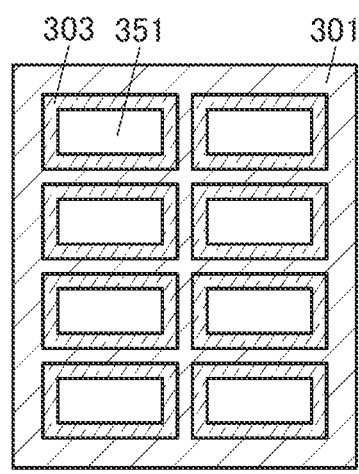
Figure 19C:
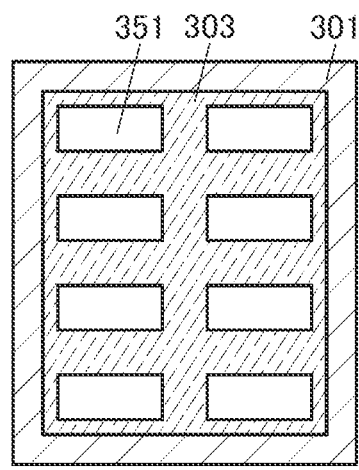

As shown in FIG. 19A, the end portion of a separation region 351 of the layer 305 is preferably the inside of the end portion of the separation layer 303. Accordingly, the yield of the separation process can be improved. When there is a plurality of regions 351, the separation layer 303 may be provided for each region 351 as shown in FIG. 19B, or the plurality of regions 351 may be provided over one separation layer 303 as shown in FIG. 19C.

The above is the description of a manufacturing method of a flexible display device.

At least part of this embodiment can be implemented in combination with any of the other embodiments described in this specification as appropriate.

Embodiment 5

This embodiment will describe examples of application of the above-described display device to vehicles, examples of vehicles, and examples of application of the above-described display device to electronic devices.

Application Example of Display Device to Vehicle

The above-described display device enables image processing corresponding to the shape of a surface to which the display device is attached. Hereinafter, examples in which the display panel is used for the periphery of a driver's seat in an automobile, which is a vehicle, will be described.

Figure 20:
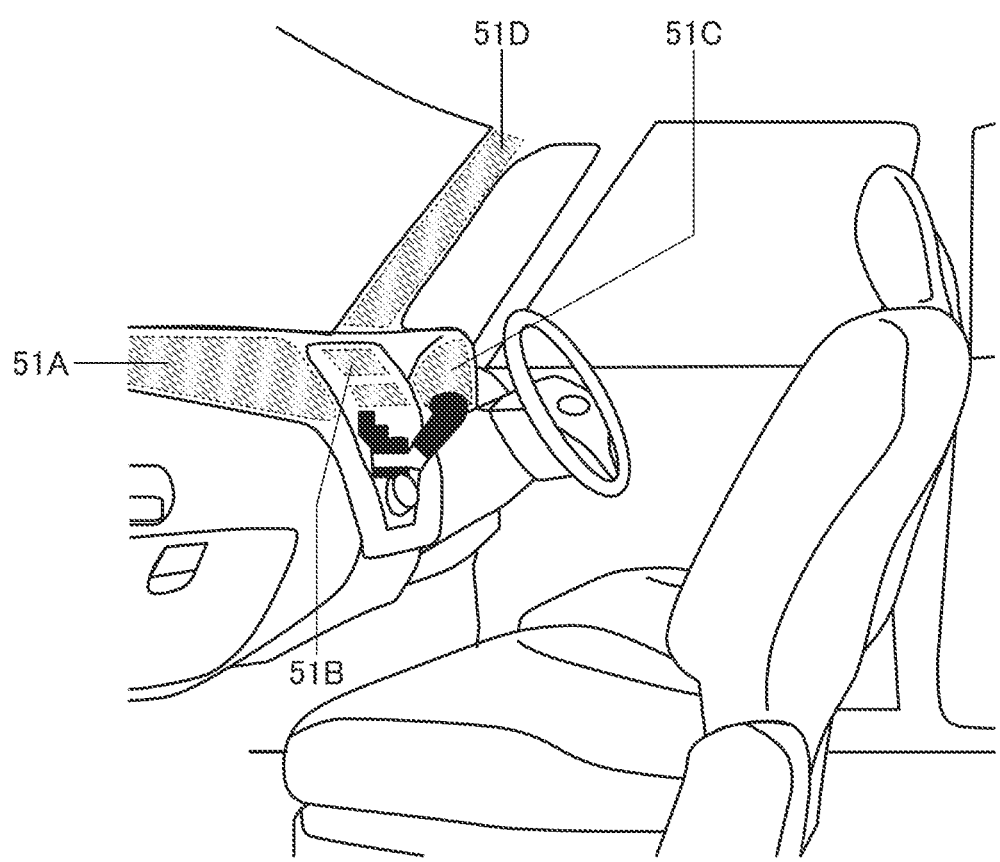
FIG. 20 illustrates structure examples of a display device in a vehicle.

FIG. 20 illustrates a windshield and its vicinity inside an automobile, for example. In FIG. 20, display devices 51A to 51C which are attached to a dashboard and a display device 51D which is attached to a pillar are illustrated.

The display devices 51A to 51C can provide a variety of kinds of information such as navigation data, a speedometer, a tachometer, a mileage, a fuel meter, a gearshift indicator, and air-condition setting. The content, layout, or the like of the display on the display devices can be changed freely to suit the user's preferences, so that the design can be improved.

The display device 51D can compensate for the view hindered by the pillar (blind areas) by displaying an image taken by an imaging unit provided for the automobile body. That is, displaying an image taken by an imaging unit provided on the outer side of the automobile body leads to elimination of blind areas and enhancement of safety. In addition, showing an image so as to compensate for the area which a driver cannot see makes it possible for the driver to confirm safety easily and comfortably.

Figure 21:
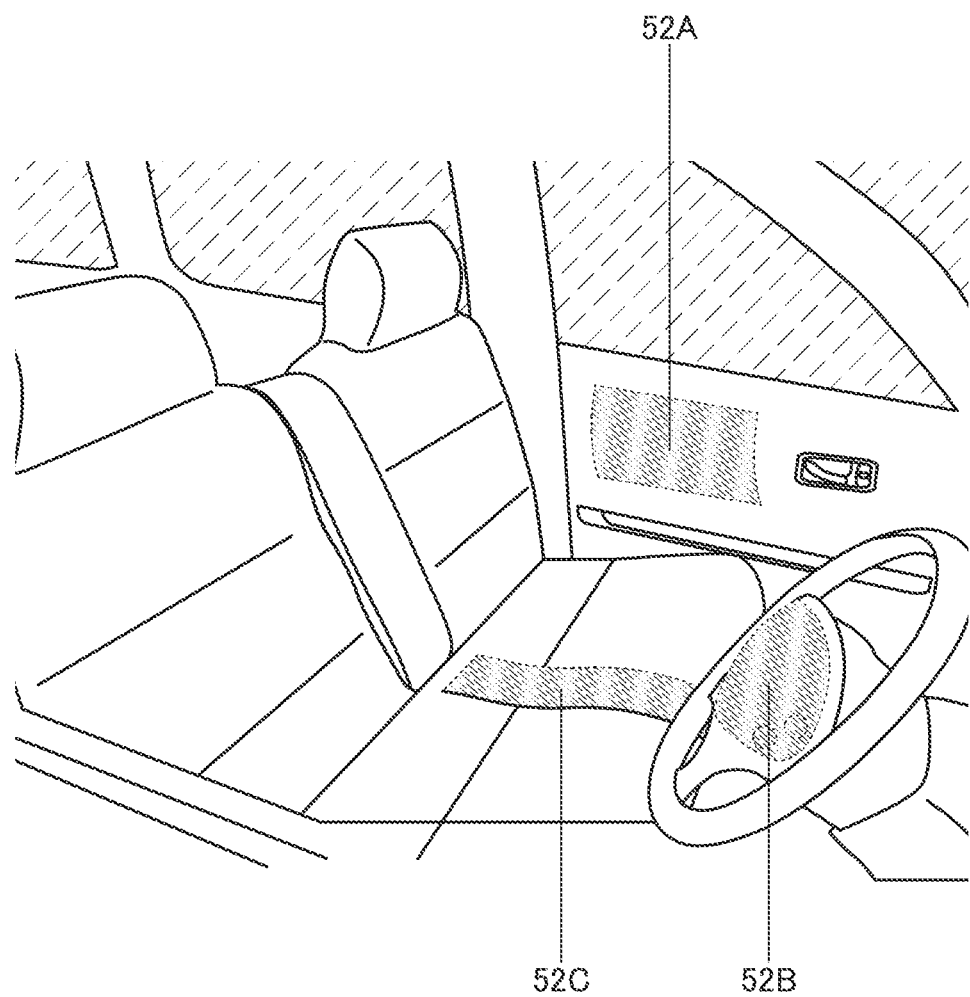
FIG. 21 illustrates structure examples of a display device in a vehicle.

FIG. 21 illustrates the inside of an automobile in which a bench seat is used for a driver's seat and a front passenger seat. FIG. 21 illustrates a display device 52A which is provided on a door, a display device 52B which is provided on a steering wheel, and a display device 52C which is provided in the middle of the seating surface of the bench seat.

The display device 52A can compensate for the view hindered by the door by displaying an image taken by an imaging unit provided for the automobile body, for example.

The display devices 52B and 52C can provide a variety of kinds of information such as navigation data, a speedometer, a tachometer, a mileage, a fuel meter, a gearshift indicator, and air-condition setting. The content, layout, or the like of the display on the display panels can be changed freely to suit the user's preferences.

Figure 22A:
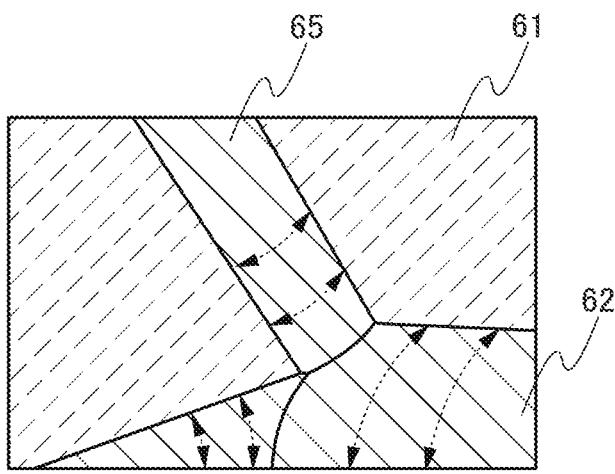
FIGS. 22A and 22B illustrate a structure example of a display device in a vehicle.
Figure 22B:
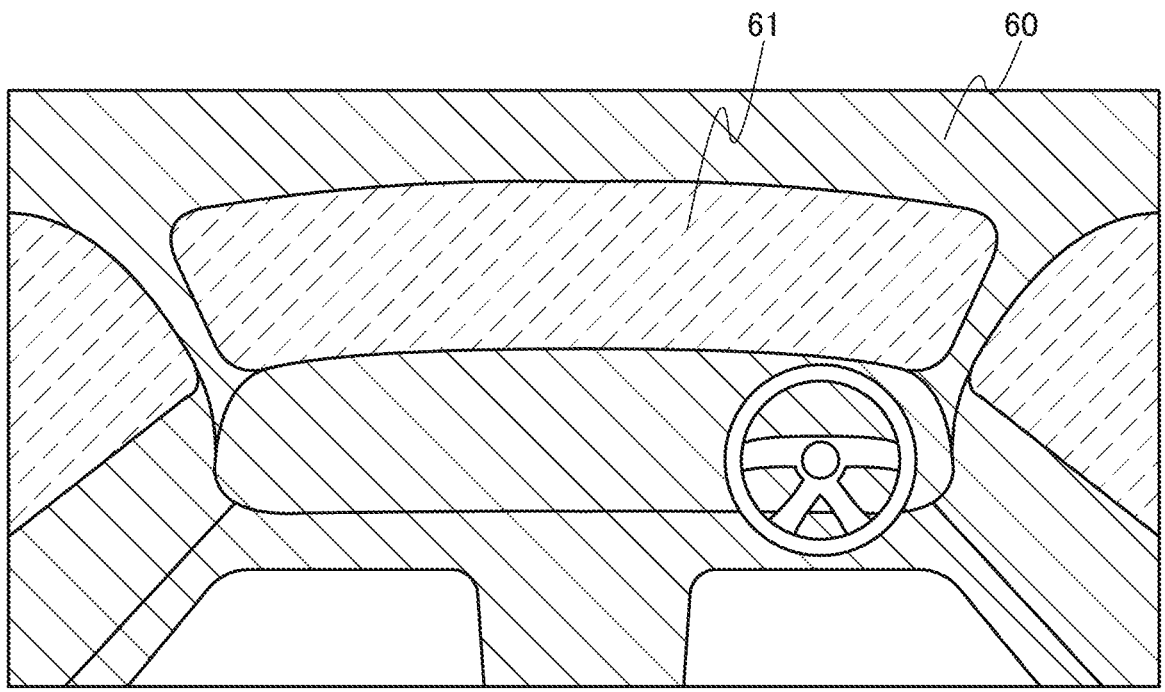

The display device of one embodiment of the present invention can be attached to a curved surface. Like the above display devices 51A to 51D and display devices 52A to 52C, for example, the display device can be attached everywhere inside the automobile. That is, the display device can be attached to a curved surface of a dashboard 62, a pillar 65, or the like except for curved surfaces of windows 61 as shown in FIG. 22A. Therefore, a display device 60 can be provided on the inner surface of the automobile body except for the windows 61 as illustrated in FIG. 22B. This structure can display images of the outside of the automobile body that compensate for a view excluding views through the windows 61, so that blind areas can be eliminated and the safety can be enhanced. In addition, high-speed image processing and reduction in power consumption can be achieved.

Figure 23A:
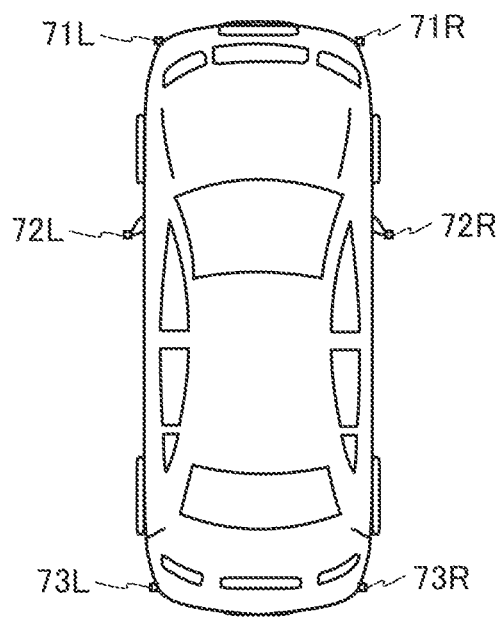
FIGS. 23A and 23B illustrate a structure example of imaging devices and a display device in a vehicle.

When the display panels are provided on the inner surfaces of the automobile body except for the windows 61 as illustrated in FIG. 22B, a plurality of imaging devices 71L to 73L, and 71R to 73R are provided on the outer side of the automobile body as illustrated in FIG. 23A. Note that two or more imaging devices are preferably arranged to obtain information about a distance to an object.

Figure 23B:
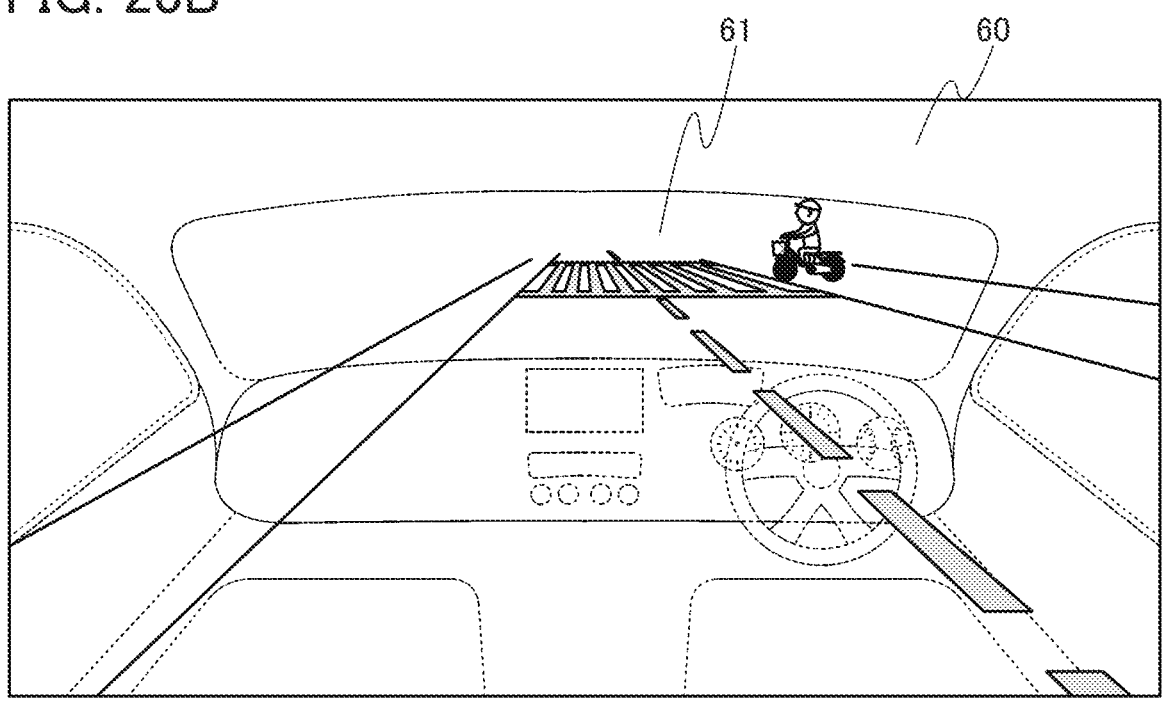

The structures in FIG. 22B and FIG. 23A make it possible to display the images of the outside of the automobile body except for the outside of the windows 61 as illustrated in FIG. 23B. Therefore, blind areas can be eliminated and the safety can be enhanced. In addition, high-speed image processing and reduction in power consumption can be achieved. The high-speed image processing enables substantially real-time display of an image taken by an imaging device, and thus the safety can be further enhanced.

Examples of Vehicle

Specific examples of vehicles in which the display device of one embodiment of the present invention can be used are shown in FIGS. 24A to 24D.

Figure 24A:
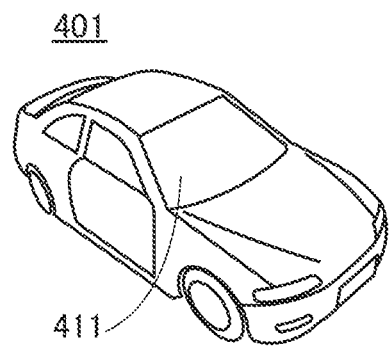
FIGS. 24A to 24D illustrate examples of vehicles.

FIG. 24A illustrates an automobile 401. The automobile 401 includes a window 411. The automobile 401 can include a display device in portions other than the window 411, i.e., portions causing blind areas. The display device can display an image that is processed, as described above. This structure enables the display portion, which is not on the window 411, to display images of the outside of the automobile 401. Thus, the automobile 401 can reduce the blind areas caused by portions other than the window 411.

Figure 24B:
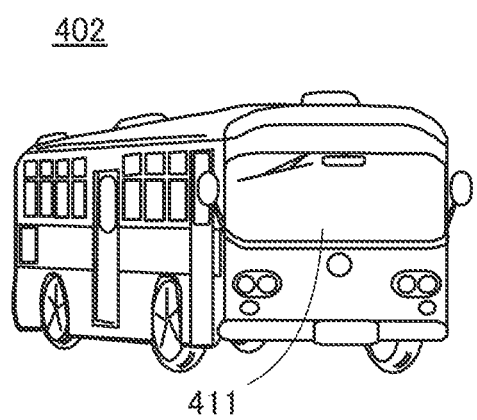

FIG. 24B illustrates a bus 402. The bus 402 includes the window 411. The bus 402 can include a display device in portions other than the window 411, i.e., portions causing blind areas. The display device can display an image that is processed, as described above. This structure enables the display portion, which is not on the window 411, to display images of the outside of the bus 402. Thus, the bus 402 can reduce the blind areas caused by portions other than the window 411.

Figure 24C:
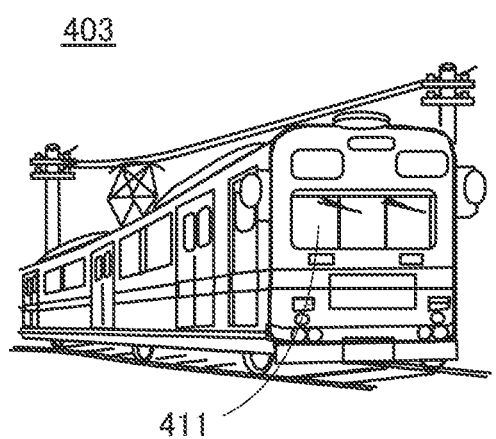

FIG. 24C illustrates a train 403. The train 403 includes the window 411. The train 403 can include in portions other than the window 411, i.e., portions causing blind areas. The display device can display an image that is processed, as described above. This structure enables the display portion, which is not on the window 411, to display images of the outside of the train 403. Thus, the train 403 can reduce the blind areas caused by portions other than the window 411.

Figure 24D:
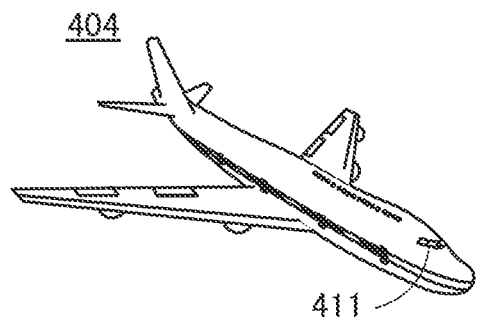

FIG. 24D illustrates an airplane 404. The airplane 404 includes the window 411. The airplane 404 can include a display device in portions other than the window 411, i.e., portions causing blind areas. The display device can display an image that is processed, as described above. This structure enables the display portion, which is not on the window 411, to display images of the outside of the airplane 404. Thus, the airplane 404 can reduce the blind areas caused by portions other than the window 411.

One embodiment of the present invention is very effective when an image is displayed in a portion except for the window 411 of a vehicle. When a user while driving sees an image displayed on a display device having a curved shape or the like, an angle between a user's sight line and the display surface is not constant; even in such a case, one embodiment of the present invention enables high-speed image processing. According to one embodiment of the present invention, a data conversion circuit and a display device that have low power consumption can be provided.

Figure 25B:
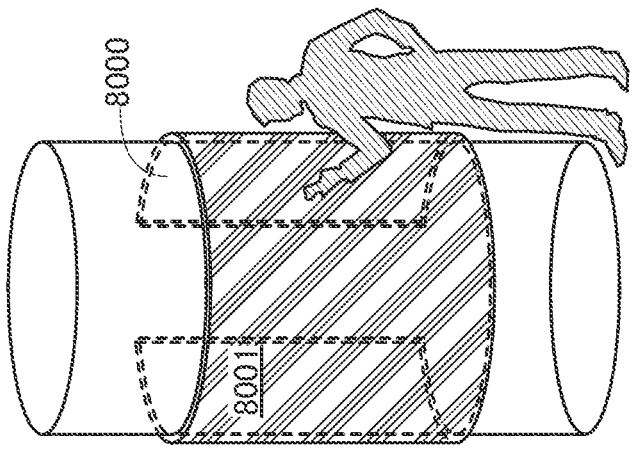
FIGS. 25A and 25B illustrate examples of electronic devices.
Figure 25A:
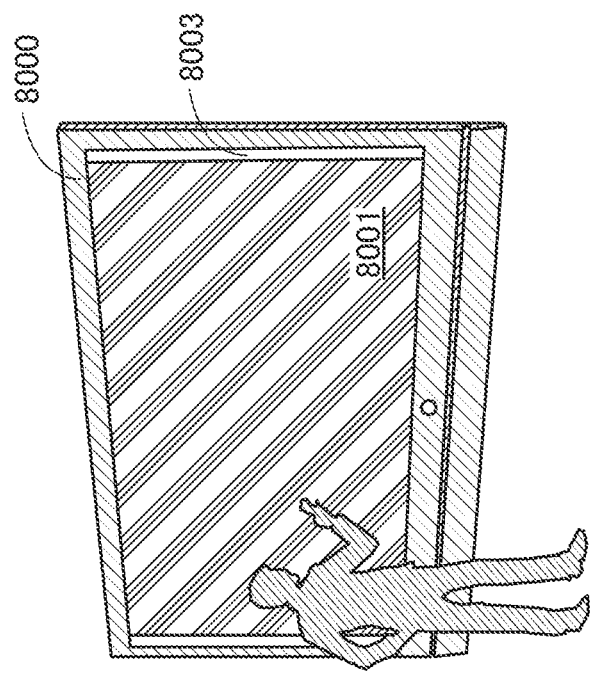

FIGS. 25A and 25B illustrate examples of digital signages. The digital signages each include a housing 8000, a display portion 8001, a speaker 8003, and the like. In addition, the digital signages can each include an LED lamp, operation keys (including a power switch or an operation switch), a connection terminal, a variety of sensors, a microphone, and the like.

FIG. 25B illustrates a digital signage mounted on a cylindrical pillar.

A larger display portion 8001 can provide more information at a time. In addition, a larger display portion 8001 attracts more attention, so that the effectiveness of the advertisement is expected to be increased, for example.

It is preferable to use a touch panel in the display portion 8001 because a device with such a structure does not just display a still or moving image, but can be operated by users intuitively. In the case where the display device of one embodiment of the present invention is used for providing information such as route information or traffic information, usability can be enhanced by intuitive operation.

One embodiment of the present invention is very effective when the display portion is large or has a complex shape (e.g., a curved shape) like the display portion 8001. When a user while walking sees an image displayed on a display device with such a shape, an angle between a user's sight line and the display surface is not constant; even in such a case, one embodiment of the present invention enables high-speed image processing. According to one embodiment of the present invention, a data conversion circuit and a display device that have low power consumption can be provided.

At least part of this embodiment can be implemented in combination with any of the other embodiments described in this specification as appropriate.

<Notes on Description of this Specification and the Like>

In this specification and the like, ordinal numbers such as "first", "second", and "third" are used in order to avoid confusion among components. Thus, the terms do not limit the number or order of components.

In a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

The same elements or elements having similar functions, elements formed using the same material, elements formed at the same time, or the like in the drawings are denoted by the same reference numerals, and the description thereof is not repeated in some cases.

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

EXPLANATION OF REFERENCE

A1-A2: section line, CLK0: clock signal, CLK1: clock signal, CLK2: clock signal, D0: data, D1: data, D2: data, D3: data, D4: data, D5: data, D6: data, GL0: gate line, GL1: gate line, GL2: gate line, GL3: gate line, GL4: gate line, GL5: gate line, P1: arrow, P2: arrow, RDATA0: readout data, RDATA1: readout data, SL0: source line, T0: time, T00: time, T1: time, T2: time, T3: time, T10: time, T20: time, T22: time, T30: time, T40: time, T41: time, T42: time, T43: time, T47: time, 10: display device, 11: pixel portion, 62: dashboard, 12: scan line driver circuit, 13: signal line driver circuit, 65: pillar, 15: terminal portion, 16a: wiring, 16b: wiring, 51A: display device, 51C: display device, 51D: display device, 52A: display device, 52B: display device, 52C: display device, 60: display device, 61: window, 71L: imaging device, 71R: imaging device, 73L: imaging device, 73R: imaging device, 100: data conversion circuit, 110: clock generation circuit, 111: clock selection control circuit, 112: circuit, 121: data latch circuit, 122: writing address generation circuit, 123: readout address generation circuit, 124: enable generation circuit, 130: inverter circuit, 131: memory circuit, 132: memory circuit, 133: data selection circuit, 140: data conversion circuit, 150: clock generation circuit, 151: clock selection control circuit, 152: circuit, 160: gate driver control circuit, 170: source driver, 180: gate driver, 181: shift register, 182: AND circuit, 190: pixel array, 191: pixel, 195: display device, 196: display device, 197A: image, 197B: image, 198: person, 199X: distortion sensor, 199Y: distortion sensor, 201: substrate, 202: substrate, 211: insulating layer, 212: insulating layer, 213: insulating layer, 214: insulating layer, 215: spacer, 216: insulating layer, 217: insulating layer, 220: bonding layer, 221: insulating layer, 222: EL layer, 223: electrode, 224: optical adjustment layer, 225: pixel electrode, 230a: structure, 230b: structure, 231: light-blocking layer, 232: coloring layer, 242: FPC, 243: connection layer, 250: space, 251: transistor, 252: transistor, 253: capacitor, 254: light-emitting element, 255: transistor, 260: sealant, 261: bonding layer, 262: bonding layer, 271: semiconductor layer, 272: conductive layer, 273: conductive layer, 274: conductive layer, 275: conductive layer, 291: conductive layer, 292: conductive layer, 293: conductive layer, 294: insulating layer, 295: bonding layer, 296: substrate, 297: FPC, 298: connection layer, 299: terminal portion, 301: formation substrate, 401: automobile, 402: bus, 403: train, 303: separation layer, 404: airplane, 305: layer subjected to separation, 307: bonding layer, 411: window, 321: formation substrate, 323: separation layer, 325: layer subjected to separation, 331: substrate, 333: bonding layer, 341: substrate, 343: bonding layer, 351: region, 8000: housing, 8001: display portion, and 8003: speaker.

This application is based on Japanese Patent Application Serial No. 2016-250225 filed with Japan Patent Office on Dec. 23, 2016, the entire contents of which are hereby incorporated by reference.

The invention claimed is:

1. A display device comprising:
a first data conversion circuit electrically connected to a first distortion sensor;
a source driver electrically connected to the first data conversion circuit; and
a pixel array electrically connected to the source driver,
wherein the first data conversion circuit comprises:
   a first clock generation circuit comprising a first control circuit;
   a latch circuit electrically connected to the first clock generation circuit; and
   a memory circuit electrically connected to the latch circuit,
wherein the first clock generation circuit is configured to be supplied with a plurality of first clock signals having different frequencies and output one of the plurality of first clock signals on the basis of a first selection signal supplied from the first control circuit, wherein the first control circuit is configured to supply the first selection signal based on a distortion signal from the first distortion sensor due to a shape folded in a long-axis direction of the source driver, wherein the latch circuit is configured to take in data from input data in synchronization with a writing clock signal and store the data as writing data, wherein the memory circuit is configured to output the writing data to the source driver as readout data in synchronization with a readout clock signal, and wherein the writing clock signal is one of the plurality of first clock signals.

2. The display device according to claim 1, further comprising:
 a first address generation circuit configured to generate first address data for writing the writing data to the memory circuit; and
 a second address generation circuit configured to generate second address data for reading out the readout data from the memory circuit,
 wherein the writing clock signal is supplied to the first address generation circuit, and
 wherein the readout clock signal is supplied to the second address generation circuit.

3. The display device according to claim 1, wherein the memory circuit is a line memory.

4. A display device comprising:
 a first data conversion circuit electrically connected to a first distortion sensor;
 a second data conversion circuit electrically connected to a second distortion sensor;
 a source driver electrically connected to the first data conversion circuit; and
 a gate driver electrically connected to the second data conversion circuit;
 a pixel array electrically connected to the source driver and the gate driver,
 wherein the first data conversion circuit comprises:
  a first clock generation circuit comprising a first control circuit;
  a latch circuit electrically connected to the first clock generation circuit; and
  a memory circuit electrically connected to the latch circuit,
 wherein the second data conversion circuit comprises a second clock generation circuit,
 wherein the first clock generation circuit is configured to be supplied with a plurality of first clock signals having different frequencies and output one of the plurality of first clock signals on the basis of a first selection signal supplied from the first control circuit,
 wherein the first control circuit is configured to supply the first selection signal based on a first distortion signal from the first distortion sensor due to a shape folded in a long-axis direction of the source driver,
 wherein the latch circuit is configured to take in data from input data in synchronization with a writing clock signal and store the data as writing data,
 wherein the memory circuit is configured to output the writing data to the source driver as readout data in synchronization with a readout clock signal,
 wherein the writing clock signal is one of the plurality of first clock signals, and
 wherein the second clock generation circuit is configured to output one of a plurality of second clock signals to the gate driver as a gate line clock signal.

5. The display device according to claim 4, further comprising:
 a first address generation circuit configured to generate first address data for writing the writing data to the memory circuit; and
 a second address generation circuit configured to generate second address data for reading out the readout data from the memory circuit,
 wherein the writing clock signal is supplied to the first address generation circuit, and
 wherein the readout clock signal is supplied to the second address generation circuit.

6. The display device according to claim 4, wherein the memory circuit is a line memory.

7. The display device according to claim 4,
 wherein the second data conversion circuit further comprises a second control circuit, and
 wherein the second control circuit is configured to supply a second selection signal based on a second distortion signal from the second distortion sensor due to a shape folded in a long-axis direction of the gate driver.

* * * * *